United States Patent
Chang et al.

(10) Patent No.: US 8,637,371 B2
(45) Date of Patent: Jan. 28, 2014

(54) NON-PLANAR MOSFET STRUCTURES WITH ASYMMETRIC RECESSED SOURCE DRAINS AND METHODS FOR MAKING THE SAME

(75) Inventors: Josephine B Chang, Mahopac, NY (US); Paul Chang, Mahopac, NY (US); Michael A Guillorn, Yorktown Heights, NY (US); Chung-hsun Lin, White Plains, NY (US); Jeffrey W Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 13/398,339

(22) Filed: Feb. 16, 2012

(65) Prior Publication Data

US 2013/0214357 A1    Aug. 22, 2013

(51) Int. Cl.
*H01L 21/336* (2006.01)

(52) U.S. Cl.
USPC .... 438/283; 438/151; 438/424; 257/E21.621; 257/E21.409; 257/E21.638

(58) Field of Classification Search
USPC ............... 438/151, 283, 424; 257/E21.409, 257/E21.621, E21.638
See application file for complete search history.

(56) References Cited

U.S. PATENT DOCUMENTS

| | | | |
|---|---|---|---|
| 4,499,656 A | 2/1985 | Fabian et al. | |
| 5,221,596 A | 6/1993 | Keller | |
| 7,829,401 B2 | 11/2010 | Yang et al. | |
| 7,915,670 B2 | 3/2011 | Anderson et al. | |
| 7,964,465 B2 * | 6/2011 | Anderson et al. | 438/283 |
| 2002/0036328 A1 | 3/2002 | Richards et al. | |
| 2008/0124868 A1 | 5/2008 | Nowak | |
| 2008/0315309 A1 | 12/2008 | Chang et al. | |
| 2009/0261425 A1 | 10/2009 | Anderson et al. | |
| 2011/0065244 A1 | 3/2011 | Chang et al. | |
| 2012/0012932 A1 * | 1/2012 | Perng et al. | 257/347 |

* cited by examiner

*Primary Examiner* — Minchul Yang
(74) *Attorney, Agent, or Firm* — Vazken Alexanian

(57) ABSTRACT

Non-planar Metal Oxide Field Effect Transistors (MOSFETs) and methods for making non-planar MOSFETs with asymmetric, recessed source and drains having improved extrinsic resistance and fringing capacitance. The methods include a fin-last, replacement gate process to form the non-planar MOSFETs and employ a retrograde metal lift-off process to form the asymmetric source/drain recesses. The lift-off process creates one recess which is off-set from a gate structure while a second recess is aligned with the structure. Thus, source/drain asymmetry is achieved by the physical structure of the source/drains, and not merely by ion implantation. The resulting non-planar device has a first channel of a fin contacting a substantially undoped area on the drain side and a doped area on the source side, thus the first channel is asymmetric. A channel on atop surface of a fin is symmetric because it contacts doped areas on both the drain and source sides.

10 Claims, 14 Drawing Sheets

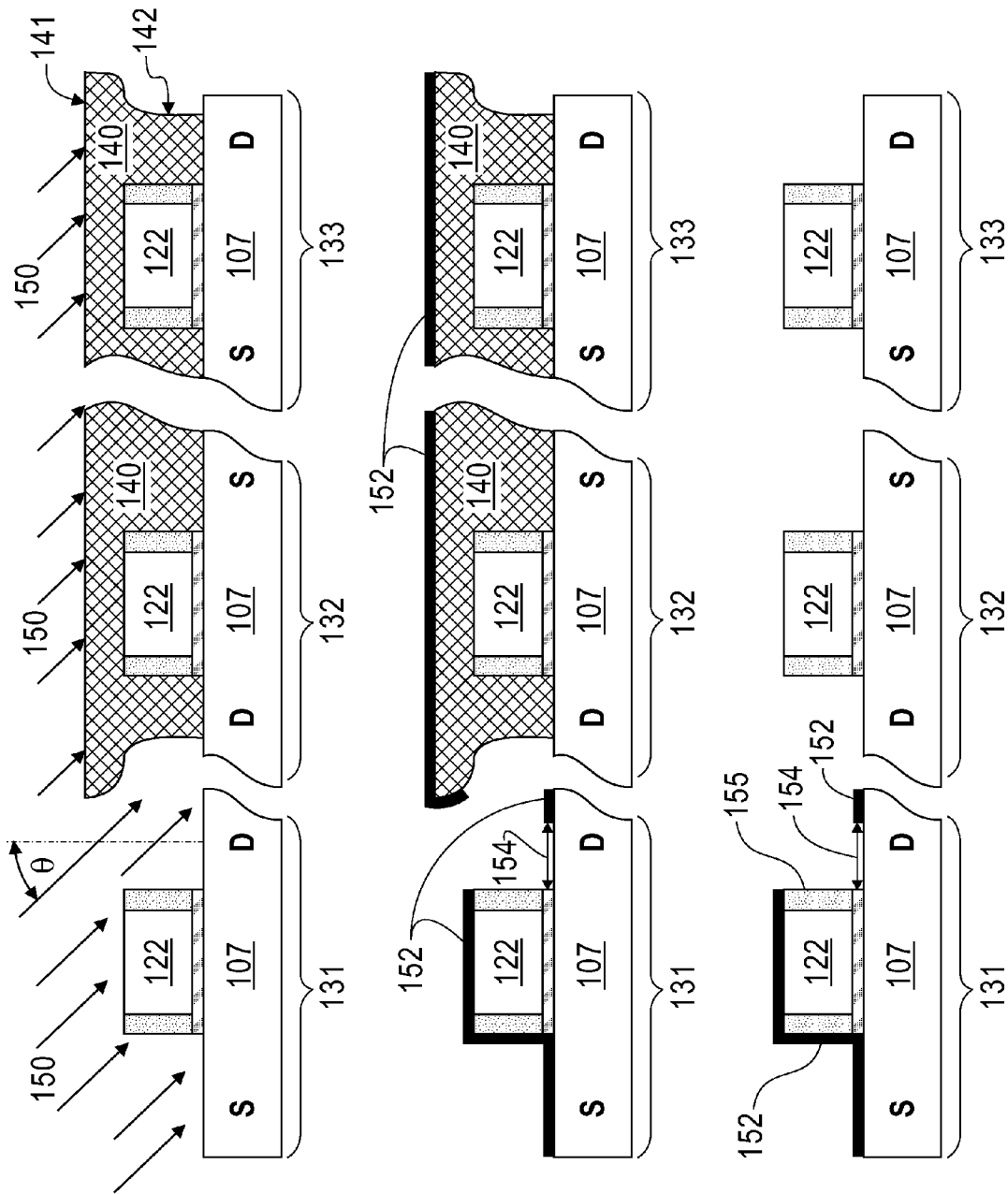

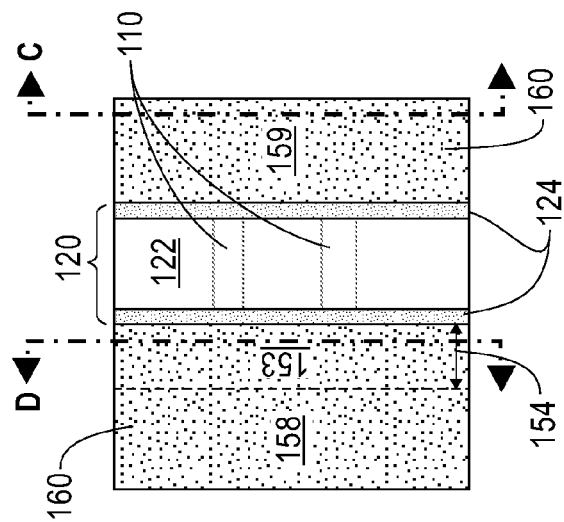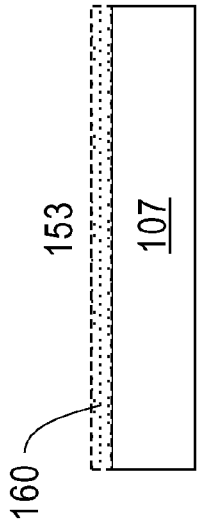
FIG. 9B
FIG. 9D
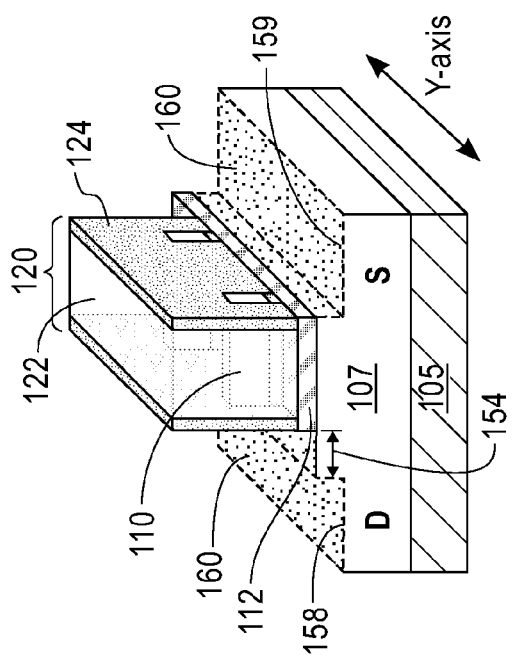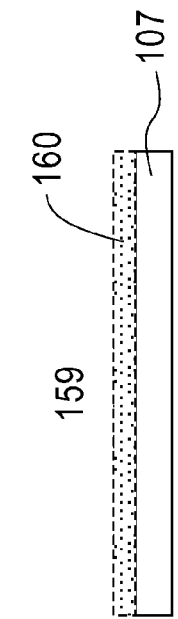
FIG. 9A
FIG. 9C

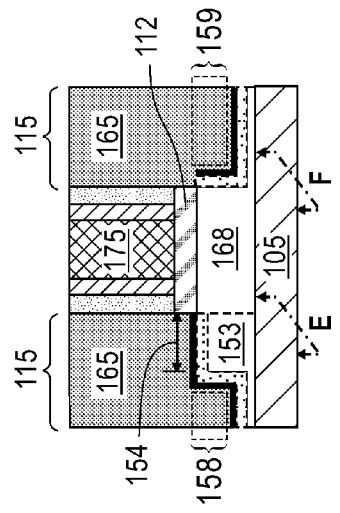
FIG. 14C
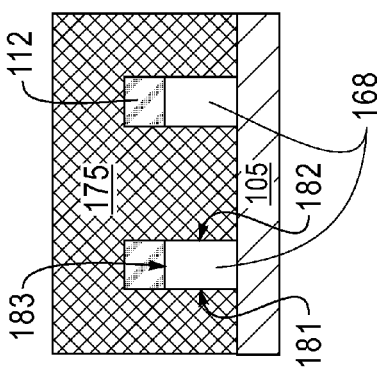
FIG. 14B
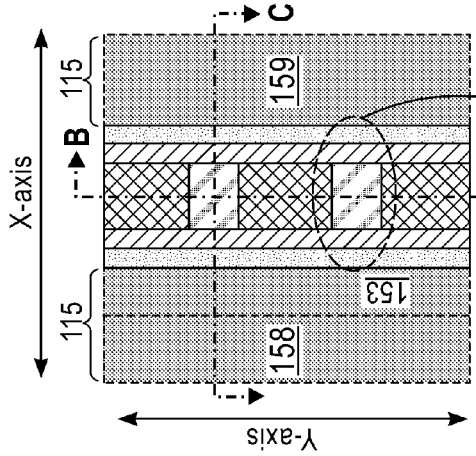
FIG. 14A
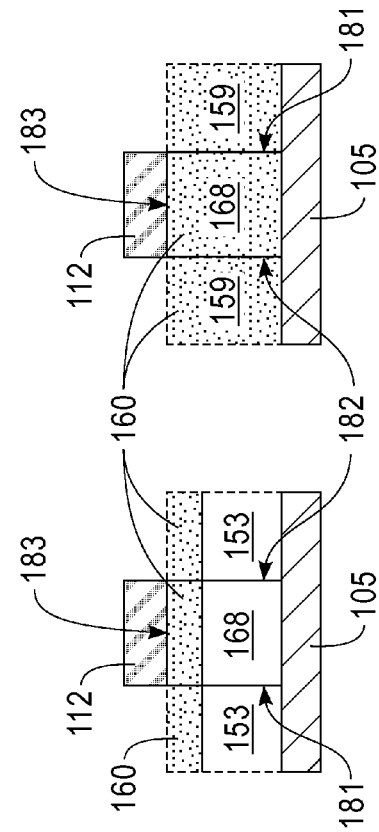
FIG. 14F
FIG. 14E
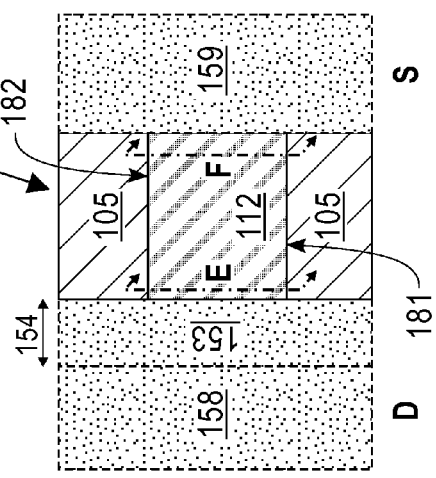
FIG. 14D

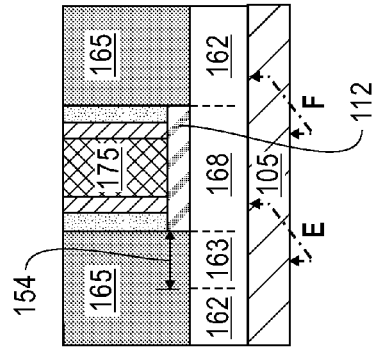
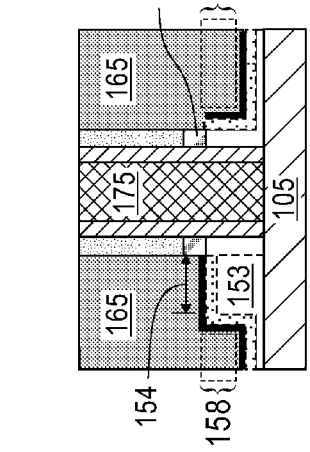
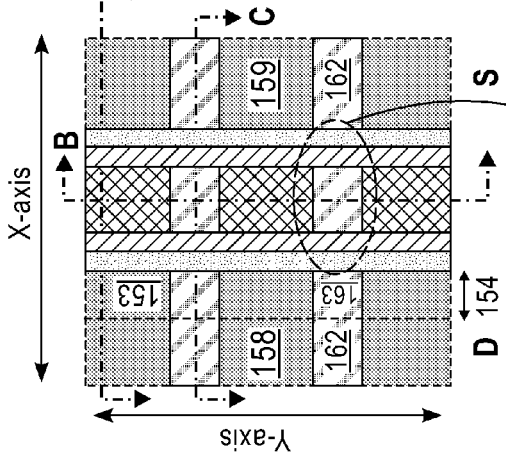
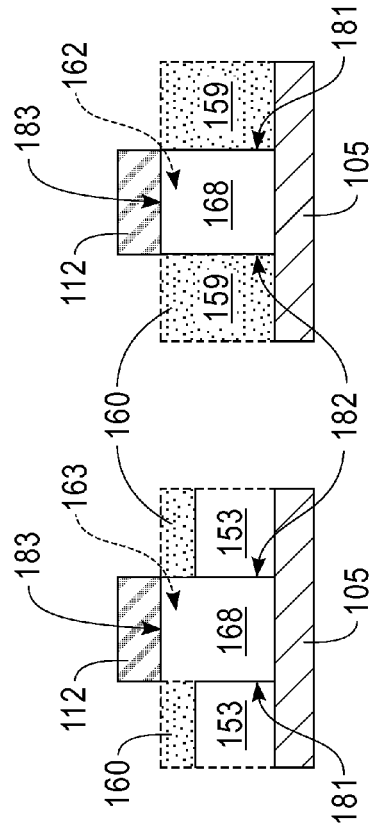
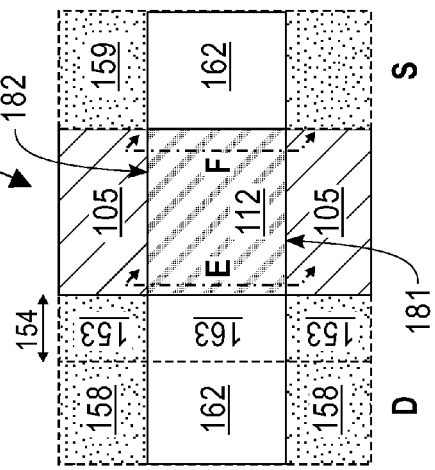
FIG. 15A  FIG. 15B  FIG. 15C  FIG. 15D  FIG. 15E  FIG. 15F

NON-PLANAR MOSFET STRUCTURES WITH ASYMMETRIC RECESSED SOURCE DRAINS AND METHODS FOR MAKING THE SAME

BACKGROUND OF THE INVENTION

1. Field of the Invention

The present invention generally relates to a Metal Oxide Semiconductor Field Effect Transistors (MOSFETs). In particular, the invention relates to non-planar MOSFETs (i.e. FinFET or tri-gate transistors) with asymmetric recessed source and drains having reduced source-side extrinsic resistance and drain-side fringing capacitance and methods of making the same. The methods include using a fin-last, replacement gate process to form the non-planar MOSFETs and, in particular, employ a retrograde metal lift-off process to form the asymmetric source/drain recesses.

2. Description of Related Art

Extrinsic resistance (herein "Rext") and fringing capacitances reduce the performance of FETs, including finFET and tri-gate transistors. In particular high capacitance in the drain side of a transistor and high resistance on the source side reduce device performance. Methods of fabricating and structures that reduce resistance and capacitance are desired.

However, techniques associated with reducing source/drain resistance to improve drive current often simultaneously increase the gate to drain capacitance, thereby increasing circuit delay. Similarly, techniques associated with reducing gate to source/drain capacitance often simultaneously increase source resistance, thereby degrading drive current. Thus, there is often a trade-off between decreasing source resistance to improve drive current and decreasing gate to drain capacitance to minimize circuit delay.

BRIEF SUMMARY OF THE INVENTION

An object of the invention is to provide a structure which provides reduced Rext and reduced fringing capacitance in a non-planar FET and methods for making the same.

According to an another aspect of the invention, a method of making a non-planar field effect transistor, the method includes providing a substrate having a semiconductor layer, a patterned fin hard mask above the semiconductor layer, and a dummy gate structure perpendicular to and above at least a portion of the patterned fin hard mask; forming a first recess and a second recess in the semiconductor layer on opposing sides of the dummy gate structure wherein the first recess is offset from a first side of the dummy gate structure; forming a source region and a drain region on opposing sides of the dummy gate structure; forming a filler layer above the substrate; removing at least a portion of the dummy gate structure to create an opening; etching, by using the patterned fin hard mask, a channel fin in the semiconductor layer in the opening; and forming a gate stack around the channel fin in the opening.

According to a further aspect of the invention, a_method of making a plurality of non-planar, asymmetric, field effect transistors, the method including providing a substrate having a first region, a second region, and a third region wherein each region of the substrate comprises a semiconductor layer, a patterned fin hard mask above the semiconductor layer, and a dummy gate structure perpendicular to and above at least a portion of the patterned fin hard mask; forming a first resist layer revealing the first region and blocking the second and the third regions of the substrate; forming a first region sacrificial metal layer by a first lift-off process wherein the first region sacrificial metal layer is asymmetrically disposed on opposing sides of the dummy gate structure in the first region; forming a second resist layer revealing the second region and blocking the first and third regions of the substrate; forming a second region sacrificial metal layer by a second lift-off process wherein the second region sacrificial metal layer is asymmetrically disposed on opposing sides of the dummy gate in the second region; forming a third resist layer revealing the third region and blocking the first and second regions of the substrate; forming a third region sacrificial metal layer by a third lift-off process wherein the third region sacrificial metal layer is symmetrically disposed on opposing sides of the dummy gate in the third region; heating the substrate so that the first, second and third sacrificial metal layers consume a portion of the semiconductor layer to form first, second and third sacrificial silicide layers; removing the first, second, and third sacrificial silicide layers to leave: a first pair of recesses in the semiconductor layer asymmetrically arranged on opposing sides of the dummy gate structure in the first region, a second pair of recesses in the semiconductor layer asymmetrically arranged on opposing sides of the dummy gate structure in the second region, and a third pair of recesses in the semiconductor layer symmetrically arranged on opposing sides of the dummy gate structure in the third region; forming source and drains in the first, second, and third regions; forming a filler layer on the substrate; removing at least a portion of the dummy gate structure in each region to create an opening in each region; etching, through the opening in each region, a channel fin in the semiconductor layer by using the patterned hard mask; and forming a gate stack in the opening in each region.

An further aspect of invention is a device including a semiconductor layer; a first recess in the semiconductor; a second recess in the semiconductor layer; and a channel fin; wherein the first and second recesses are asymmetrically positioned relative to a first gate stack.

An advantage of the present invention is reduced fringing capacitance and reduced external resistance.

A further advantage of the present, is the ability to make a chip having numerous device configurations including: source up with asymmetric source/drains, source down with asymmetric source/drains, and symmetric source/drains.

Another advantage of the present invention is the ability to create symmetric and asymmetric channels within the same tri-gate device.

Other characteristics and advantages of the invention will become obvious in combination with the description of accompanying drawings, wherein the same number represents the same or similar parts in all figures.

BRIEF DESCRIPTION OF THE SEVERAL VIEWS OF THE DRAWINGS

FIG. 3A illustrates metal deposition at an oblique angle over substrate regions in an embodiment of a lift-off process;

FIG. 3B illustrates an intermediate step of a lift-off process according to an embodiment of the present invention;

FIG. 3C illustrates a metal layer asymmetrically deposited on a substrate after lifting off excess metal according to an embodiment of the present invention;

FIG. 9A illustrates a three dimensional view of a substrate with asymmetric recesses and dopants and trimmed patterned fin hard masks according to an embodiment of the current invention;

FIG. 9B illustrates a top down view of substrate of FIG. 9A;

FIG. 9C illustrates a cross-section of FIG. 9A parallel to the dummy gate structure and through the second recess in the semiconductor layer according to an embodiment of the current invention;

FIG. 9D illustrates a cross-section of FIG. 9A parallel to the dummy gate structure and through the offset region of the semiconductor layer according to an embodiment of the current invention;

FIG. 14A illustrates a top down representation of a completed substrate made by a trimmed embodiment of the current invention;

FIG. 14B illustrates a cross-section of a completed trimmed substrate taken along the y-axis through the gate region according to an embodiment of the current invention;

FIG. 14C illustrates a cross-section of a completed trimmed substrate taken along the x-axis through a channel fin according to an embodiment of the current invention;

FIG. 14D illustrates a top down view of a channel fin of a trimmed embodiment of the current invention;

FIG. 14E illustrates a cross-section along the y-axis of FIG. 14D where the channel fin meets the field region;

FIG. 14F illustrates a cross-section along the y-axis of FIG. 14D where the channel fin meets a second recess in a field region;

FIG. 15A illustrates a top down representation of a completed substrate made by an untrimmed embodiment of the current invention;

FIG. 15B illustrates a cross-section of FIG. 15A taken along the x-axis through a first recess, plateau and second recess according to an embodiment of the current invention;

FIG. 15C illustrates a cross-section of FIG. 15A taken along the x-axis through a field fin, plateau fin and channel fin according to an embodiment of the current invention;

FIG. 15D illustrates a top down view of a channel fin of FIG. 15A;

FIG. 15E illustrates a cross-section along the y-axis of FIG. 15D where the channel fin meets the field region having an offset; and FIG. 15F illustrates a cross-section along the y-axis FIG. 15D where the channel fin meets a second recess in a field region.

DETAILED DESCRIPTION OF THE INVENTION

The basic principle of the invention is a method of making non-planar MOSFETs having reduced source-side Rext and drain-side fringing capacitance. The method includes untrimmed and trimmed embodiments which will be described in conjunction with FIGS. 1-13. The method also includes a method of making a plurality of non-planar transistor having different configurations including asymmetric source up, asymmetric source down and symmetric. The invention further includes structures of non-planar transistors made by the untrimmed and trimmed methods. The structures will be described in conjunction with FIGS. 14 and 15. A detailed description of the invention is made in combination with the following embodiments.

Methods

Figure 1:
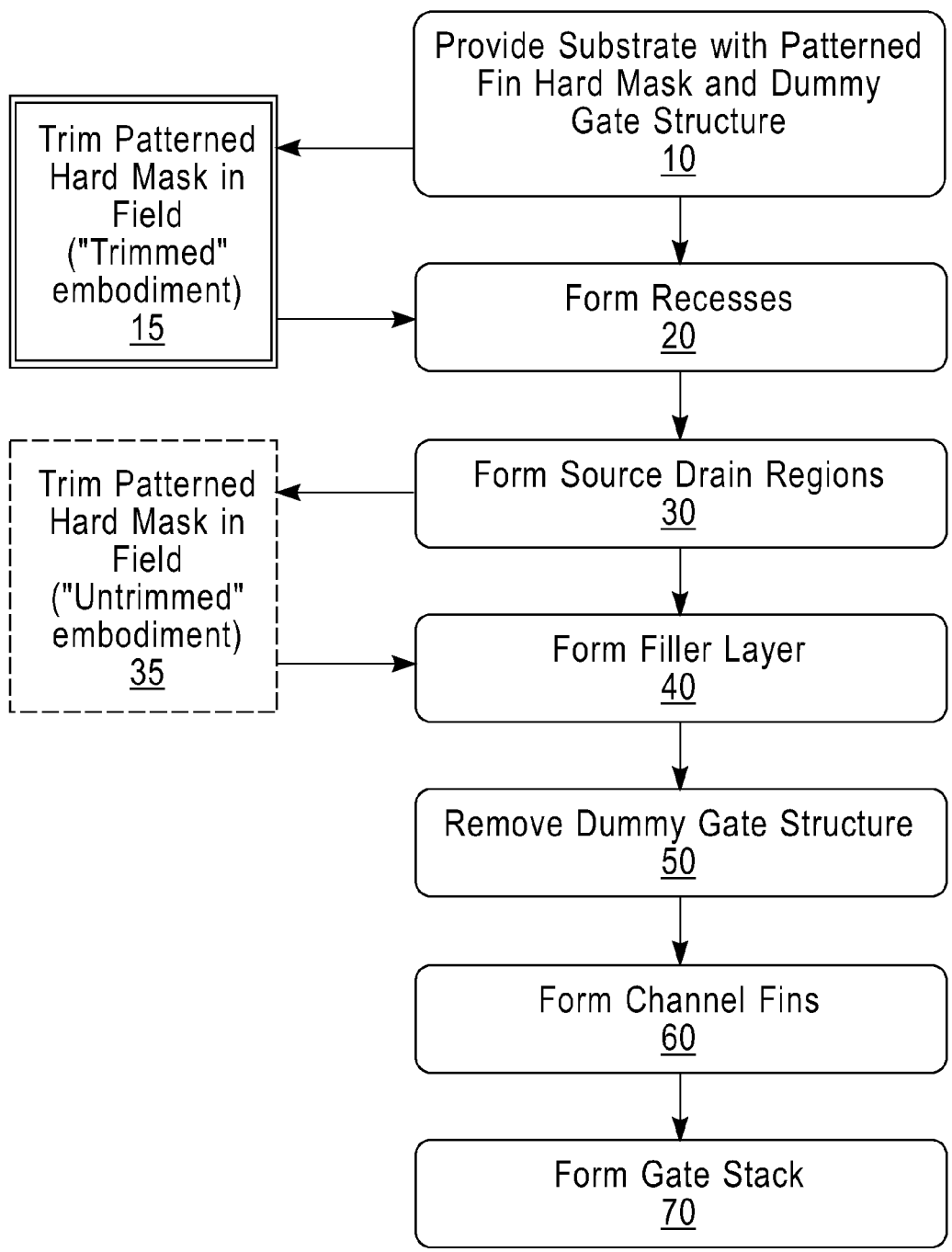
FIG. 1 is a flow chart 5 with the steps of creating a non-planar MOSFET with asymmetric, recessed source drains according to one embodiment.

FIG. 1 is a flow chart 5 with the steps of creating a non-planar MOSFET with asymmetric, recessed source drains according to untrimmed and trimmed embodiments. In both embodiments a fin-last, replacement gate process is used to create the device. Steps common to both the untrimmed and trimmed embodiments are in a box having a single solid line. Steps unique to the untrimmed embodiment are in a box having a dashed line. Steps unique to the trimmed embodiment are in a box having a double line.

Common step 10 is providing a substrate with a patterned fin hard mask and dummy gate structure perpendicular to the patterned fin hard mask; step 15, unique to the trimmed embodiment, is trimming the patterned fin hard mask in the field area prior to forming recesses; common step 20 is creating recesses on opposing side of the dummy gate structure; common step 30 is forming source drain regions; step 35, unique to the untrimmed embodiment, is trimming the patterned fin hard mask in the field area after the recesses have been formed; common step 40 is forming a filler layer; common step 50 is removing the dummy gate structure to form an opening and exposing the patterned fin hard mask and a portion of the substrate in the gate region; common step 60 is etching the exposed portion of the substrate to form a channel fin; common step 70 is forming gate stack. Each of the steps will be discussed in detail below.

From the above description, it is clear that "trimming" refers to removing patterned fin hard mask from the field region while leaving the patterned fin hard mask in the gate region. Trimming of the patterned fin hard mask occurs in both the trimmed and untrimmed embodiments, the difference is the timing of the trim. In the trimmed embodiment, the patterned fin hard mask is trimmed sometime prior to recess formation. In the untrimmed embodiment, or perhaps more accurately, the later-trimmed process, the trimming occurs some time after the recesses are formed.

Figure 2A:
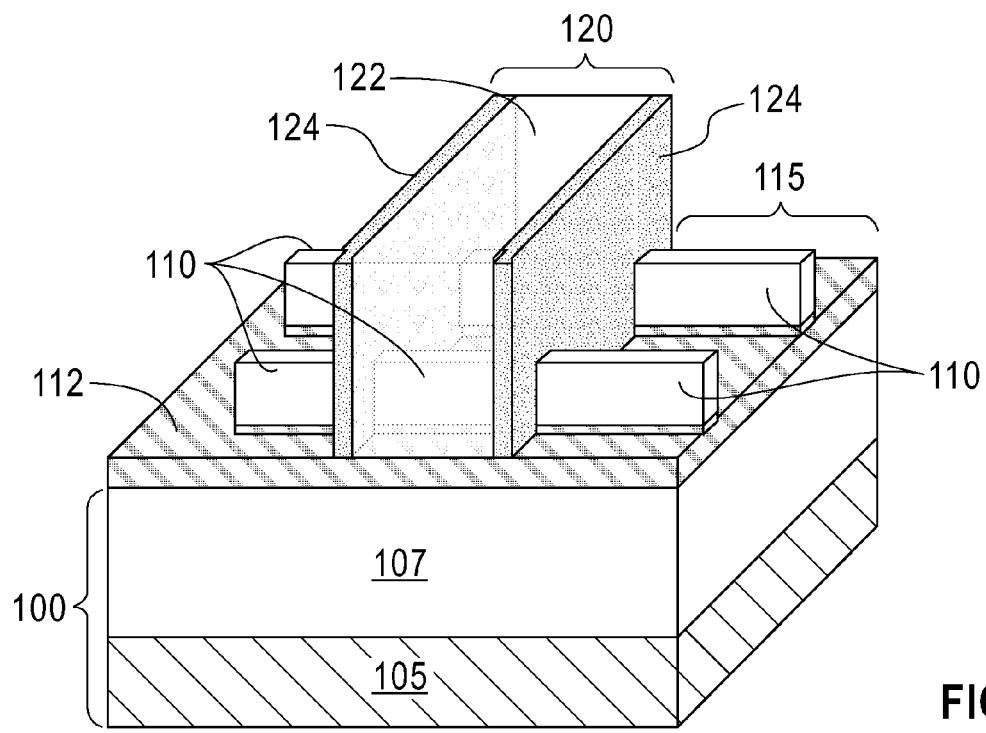
FIG. 2A illustrates a substrate having a dummy gate structure over and perpendicular to untrimmed patterned fin hard masks according to an embodiment of the present invention.
Figure 2B:
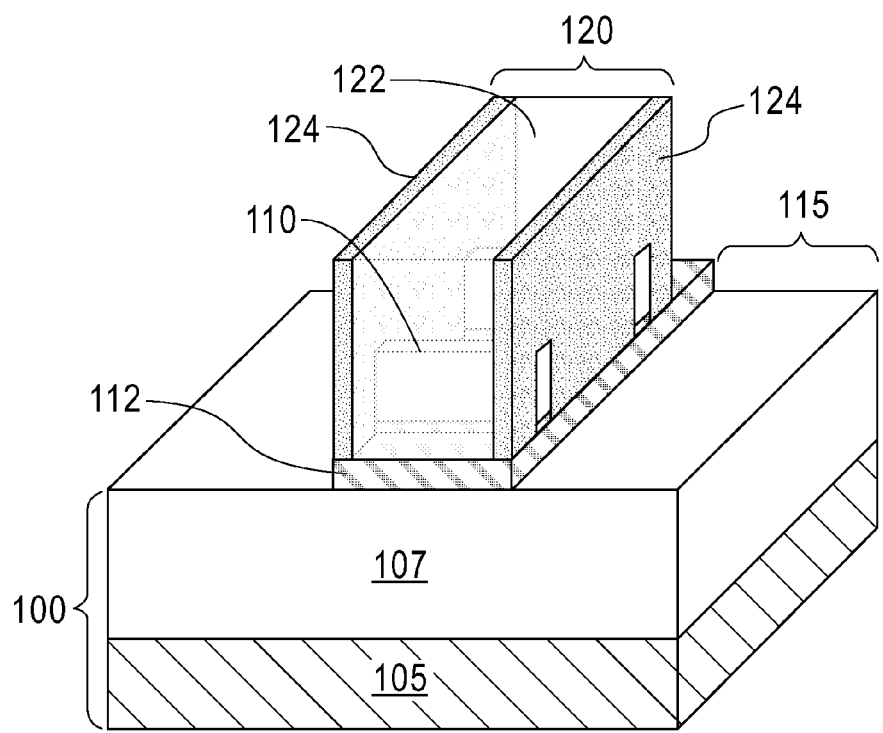
FIG. 2B illustrates a substrate with dummy gate structure over and perpendicular trimmed patterned hard masks according to an embodiment of the present invention.

Referring to FIGS. 2A and 2B, step 10 of creating a non-planar MOSFET with asymmetric, recessed source drains is providing a substrate 100 having a patterned hard masks 110 and a dummy gate structure 120 over and perpendicular to the patterned hard masks 110.

The substrates 100 in FIGS. 2A and 2B are preferably a semiconductor on insulator substrate (SOI). The SOI substrate can be an extremely thin SOI substrate (ETSOI). Alternatively, the substrate 100 could also be a bulk semiconductor substrate.

Referring to FIGS. 2A and 2B, all SOI substrates are made of three parts: a bottom bulk semiconductor portion (not shown), a buried insulator 105 section (referred to as "BOX") on top of the bulk portion, and a semiconductor layer 107 on top of the BOX 105. In this application, the SOI substrate as a whole (i.e. all three layers: bulk, BOX 105 and semiconductor layer 107) is referred to as "SOI substrate". Note, with an SOI substrate 100, a top surface of the substrate 102 is equivalent to the top surface of the semiconductor layer 107.

Continuing with FIGS. 2A and 2B, the BOX 105 may be formed from an implantation process or a bonding process. Typically, the insulating layer of the BOX is an oxide, preferably silicon dioxide. The semiconductor layer 107, can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The thickness of the semiconductor layer 107 can vary. A thickness of semiconductor layer 107 of the starting SOI substrate may be from about 2 nm to about 50 nm and ranges therebetween, but is preferably from about 10 nm to about 30 nm or any other range in between.

The patterned fin hard masks 110 can be made from any insulating layer. In a preferred embodiment the fin hard masks 110 can be etched selectively to the semiconductor layer 107. Examples of films that can be etched selectively include silicon oxide, silicon nitride, or a stack of silicon nitride on top of silicon oxide. In a preferred embodiment, the patterned fin hard mask 110 is silicon nitride. The patterned fin hard mask 110 can be deposited using low-pressure chemical vapor deposition (LPCVD) to a thickness from about 5 nm and to about 30 nm and ranges therebetween, and preferably about 20 nm. The hard mask is patterned using conventional lithography techniques in a pattern that will later be used to form the fins.

Between the patterned fin hard masks 110 and the semiconductor layer 107 of the substrate is an optional oxide layer 112. According to an exemplary embodiment, oxide layer 112 comprises $SiO_2$, and is preferably formed using thermal oxidation. The optional oxide layer 112 can have a thickness from about 0.5 nm to about 25 nm and ranges therebetween, and preferably about 2 nm.

The dummy gate structure 120 is perpendicular to and straddles a portion of the patterned fin hard masks 110. Thus, in an untrimmed embodiment shown in FIG. 2A, a portion of the patterned fin hard mask 110 extends from opposing sides of the dummy gate structure 120 while another portion of the patterned hard mask 110 is under the dummy gate structure 120. Thus, in FIG. 2A there is patterned fin hard mask 110 in the field region 115 of the substrate (i.e. the region on either side of the dummy gate structure 120) as well as the gate region (i.e. the region under the dummy gate structure 120).

FIG. 2B is an alternate embodiment illustrating a trimmed substrate. In FIG. 2B the field region 115 patterned fin hard mask 110 has been removed (Step 15 of flow chart 5). In this alternate embodiment, only the portions of the patterned fin hard mask 110 under the dummy gate structure 120 (i.e. in the gate region of the substrate) remain. It should be note that when the "trimmed" option is used, the optional oxide layer 112, if present, will be removed in exposed areas (field region). It should also be noted, that when the trimmed option is not used, the optional oxide layer 112 should be removed in exposed areas prior to creating recesses (see next paragraph). The optional oxide layer 112 can be removed using a dry or wet etch.

The dummy gate structure 120, as shown in FIGS. 2A and 2B, includes two features, a dummy gate 122 and an optional spacer 124. While the dummy gate 122 is shown as a single rectangle, it is preferably composed of multiple materials, and even more preferably, the materials are stacked in layers. For example, the dummy gate may be formed of silicon nitride ($Si_xN_yH_z$) on top of a thin oxide (preferably $Si_xO_yH_z$); or may be formed of a nitride cap ($Si_xN_yH_z$) on polysilicon. Other variants of the materials and ordering of the layers are also acceptable as long as the final (top) layer of the dummy gate 122 has sufficient stopping (etch or CMP) properties. The overall height of the dummy gate 122 may range from 20 nm to 100 nm or any other range in between. The optional spacer 124 may be made from any insulating material, and preferably is a silicon nitride material. The width of the spacer may range from about 2 nm to about 60 nm and ranges therebetween, and is preferably around 5 nm. Details on fabrication of the dummy gate structure can be found in published U.S. patent application 2008/0315309 A2 by Chang et al., the entire contents of which are herein incorporated by reference.

Referring to FIGS. 3-6, step 20 of creating a non-planar MOSFET with asymmetric, recessed source drains is forming the recesses. In an embodiment, recesses are created in the semiconductor layer 107 by a multi-step metal lift-off and silicide process. Generally speaking, the multi-step recess creating process entails: (1) a metal lift-off process which leaves a metal layer asymmetrically positioned, with respect to the dummy gate structure, on the semiconductor layer; (2) annealing the metal to form a silicide selectively with the semiconductor layer; and (3) removing the silicide to leave recesses asymmetrically positioned with respect to the dummy gate structure. Each step will be discussed in further detail below.

Referring to an embodiment in FIG. 3A, three regions 131, 132, 133 of a substrate are shown. The substrate, for ease of illustration, only shows the semiconductor layer 107 of the substrate. The three regions are a first region 131, a second region 132 and a third region 133. Each of the regions has a dummy gate structure 120 having a dummy gate 122 and optional spacer 124. Each of the three regions has an "S" or a "D" label indicating the location of future source and drain areas. In the first region 131, the S is to the left of the dummy gate structure 120, while the drain is on the opposing side (the right) of the dummy gate structure 120. Thus, the first region is a source up region. In the second region 132, the D is to the left of the dummy gate structure 120, while the S is on the opposing side (the right) of the dummy gate structure 120. Thus, the second region is a source down region.

Continuing with FIG. 3A, a photoresist layer 140 blocks the second and third regions 132 and 133 while revealing the first region 131. Preferably the resist layer 140 has a retrograde profile meaning the top 141 of the resist layer 140 overhangs the bottom 142 of the resist layer 140.

Still referring to FIG. 3A, a metal deposition 150, represented by arrows, occurs at a tilt angle (theta) relative to a line normal to the substrate. The metal may be deposited by sputtering, CVD, plating, or, preferably, by evaporation. The metal can include nickel, platinum, titanium, tungsten, cobalt, a combination of the foregoing metals or any other metal capable of forming a silicide with the semiconductor layer 107.

Because the deposition 150 occurs at a tilt angle, the dummy gate structure 120 blocks the metal from reaching the semiconductor layer 107 on one side of the dummy gate structure 120. The result, referring to FIG. 3B, is a sacrificial metal layer 152 deposited on the resist layer 140, and in the first region 131 of the substrate on (1) a portion of the dummy gate structure 120, (2) the semiconductor layer 107 on one side of the dummy gate structure 120, and (3) the semiconductor layer 107 offset a distance 154 from a first side 155 of the dummy gate structure 120 on the opposing side of the dummy gate structure 120. Thus, the sacrificial metal layer 152 is asymmetrically deposited with respect to the dummy gate structure 120. In particular, because in this example the tilt angle was to the left of normal (i.e. a negative tilt angle), the semiconductor layer 107 on the left side (source up configuration of region 131) of the dummy gate structure 120 is covered with the metal layer sacrificial over the future source. Meanwhile, the right side (future drain) has an offset sacrificial metal layer 152. The distance of the offset 154 depends upon the height of the dummy gate structure and the tilt angle.

Referring to FIG. 3C, the resist layer 140 is removed and in doing so lifts-off the sacrificial metal layer 152 on top of the resist. The result is a sacrificial metal layer 152 asymmetrically disposed around the dummy gate structure 120 in the first region 131 of the substrate while the second 132 and third 133 regions of the substrate have no metal layer.

The lift-off process can be repeated as many times a desired to create different regions having symmetric or asymmetric metal layers. For example, the lift-off process can occur a second time, however, this time the resist 140 blocks the first 131 and third 133 regions of the substrate while the 132 second region is revealed. If the metal deposition 150 occurs at a positive tilt angle (i.e. theta is right of a line normal to the substrate), then the left side of the dummy gate is shadowed and an off-set is created on the left side of the dummy gate structure 120. Alternatively, the lift off process can occur with the resist blocking the first and second regions while the third region is revealed. If the metal deposition 150 is normal to the substrate (i.e. no tilt angle or, stated another way, tilt angle=0) then the sacrificial metal layer 152 is symmetric about the dummy gate structure 120.

Figure 4:
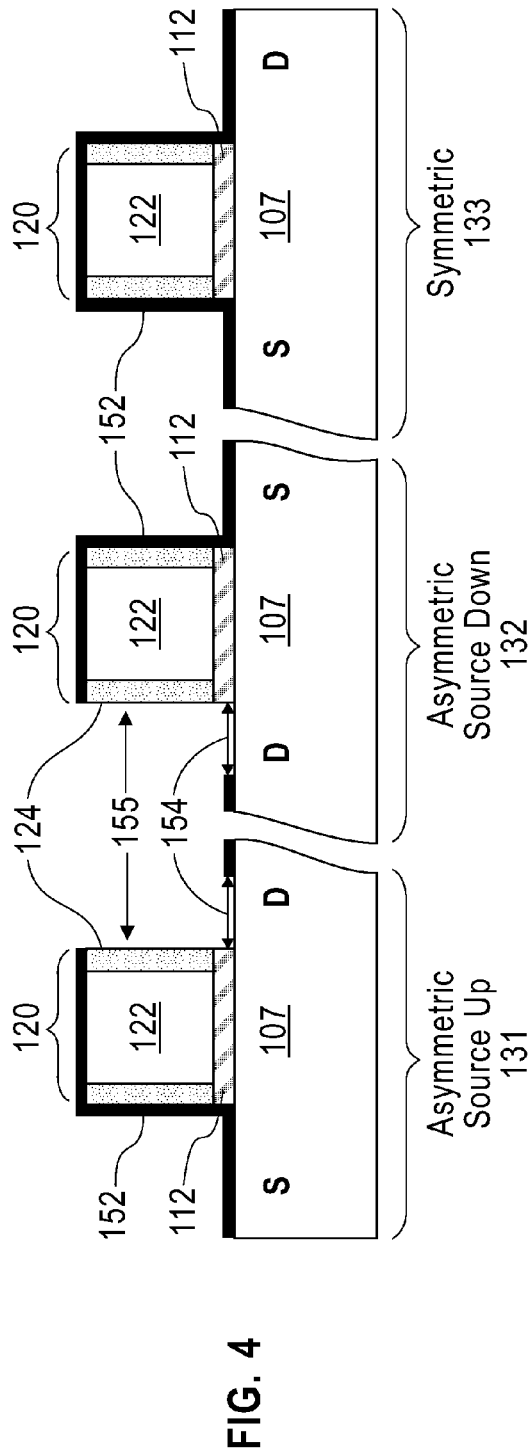
FIG. 4 illustrates metal layers asymmetrically and symmetrically deposited over different substrate regions according to an embodiment of the present invention.

FIG. 4 illustrates first, second and third regions of the substrate which each received a lift-off process with a negative, positive and no tilt angle respectively. A result is a first region 131 (here, having a source up configuration) with an asymmetric sacrificial metal layer 152 relative to the dummy gate structure 120. The asymmetry manifests as an offset distance 154 from the right side (here, future drain) of the dummy gate structure while the sacrificial metal layer 152 on the opposing side of the dummy gate structure (left side; here, future source) is next to the gate structure 120. Another result is a second region 132 (here, having a source down configuration) with an asymmetric sacrificial metal layer 152 relative to the dummy gate structure 120. The asymmetry manifests as an offset distance 154 from the left side (here, future drain) of the dummy gate structure while the metal layer 153 on the opposing side of the dummy gate structure (right side; here future source) is next to the gate structure 120. A further result is a third region 133 (here, having a source up configuration) with a symmetric sacrificial metal layer 152 relative to the dummy gate structure 120. The symmetry manifests as sacrificial metal layers 152 on the right and left sides of the dummy gate structure 120 are next to the dummy gate structure 120. Here, "next to the dummy gate structure" means there is no off-set distance between the sacrificial metal layer 152 and the dummy gate structure 120.

Figure 5:
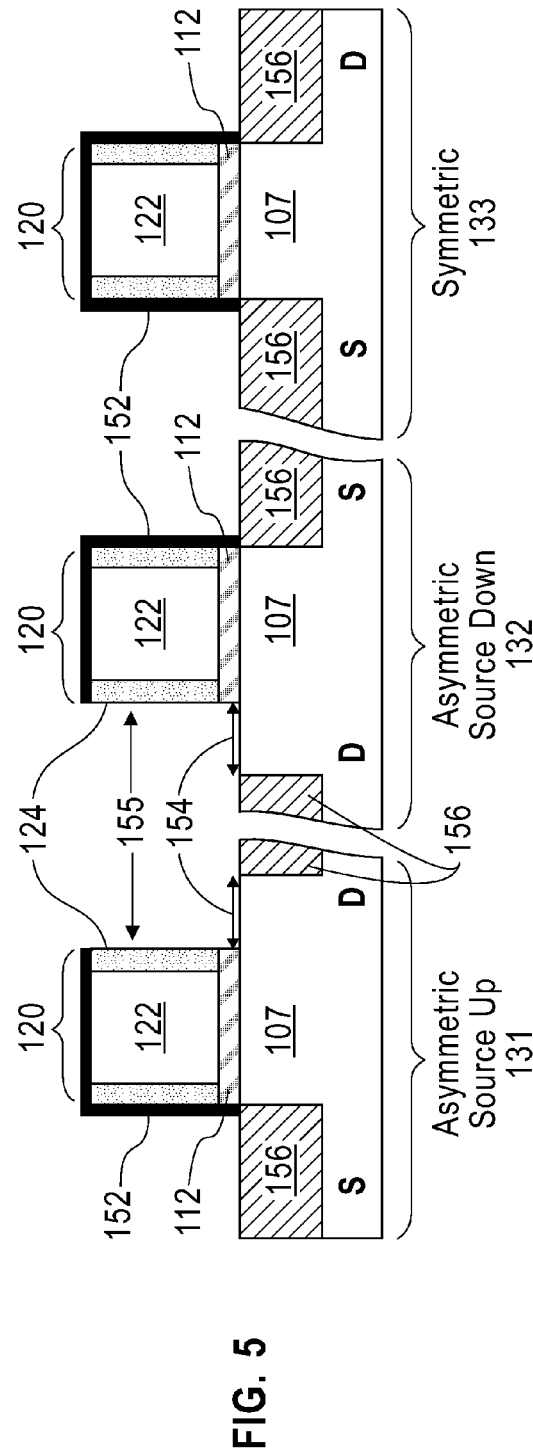
FIG. 5 illustrates silicide layers asymmetrically and symmetrically formed in different substrate regions according to an embodiment of the present invention.

Referring to FIG. 5, the second step in the multi-step process of forming a recess in the semiconductor layer 107 is annealing the substrate to form a sacrificial silicide layer 156. Annealing the substrate causes the sacrificial metal layer 152 and the semiconductor layer 107 to react to form a sacrificial metal silicide 156. During the reaction, a portion of the semiconductor layer 107 is consumed. For example, if the sacrificial metal layer 152 is cobalt, then for each nm of cobalt deposited and reacting to form cobalt silicide, about 3.64 nm of silicon from the semiconductor layer 107 will be consumed. A substrate after annealing to form sacrificial silicide layers 156 is shown in FIG. 5. Note, sacrificial metal layers 152 in contact with insulator layers of the dummy gate structure 120 do not react during anneal and remain. The silicide formation anneal temperature will depend on the particular metal used to form the silicide, but generally can range from about 500 C to about 900 C and ranges therebetween.

Figure 6:
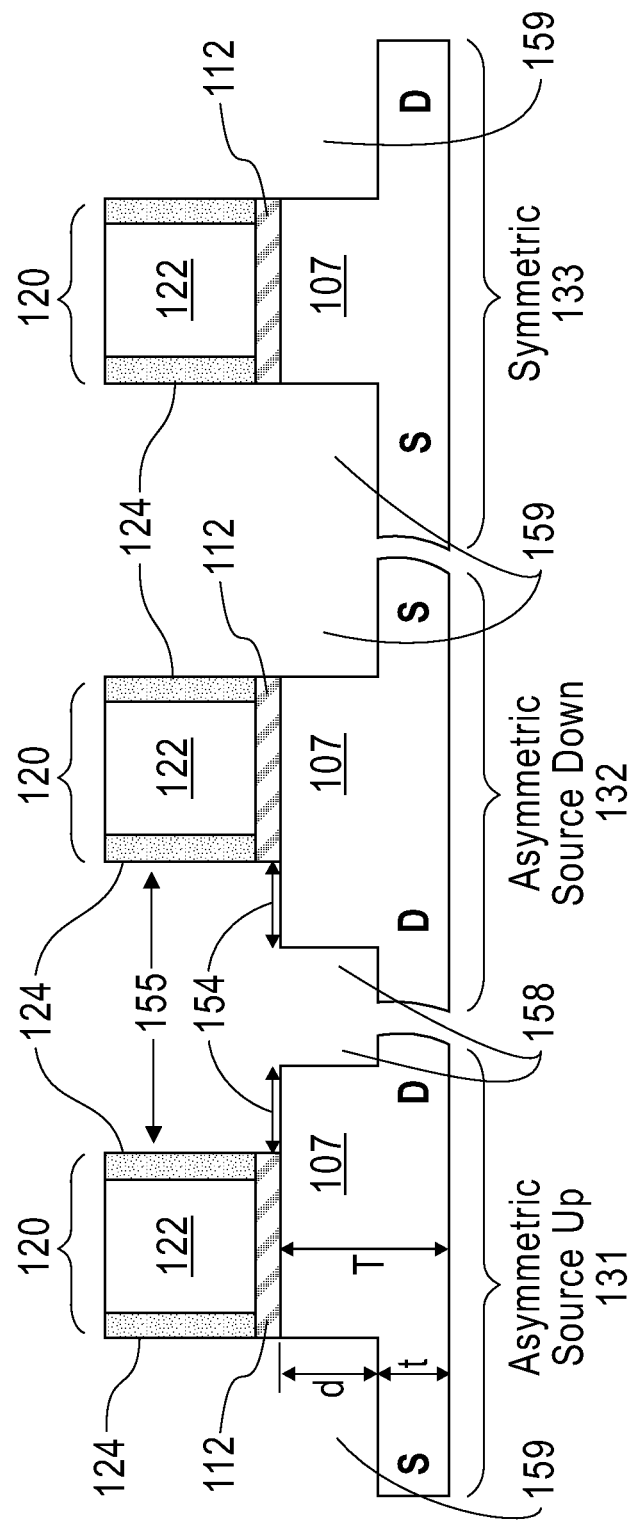
FIG. 6 illustrates recesses asymmetrically and symmetrically formed in different substrate regions according to an embodiment of the present invention.

Referring to FIG. 6, the third step in the multi-step process of forming a recess in the semiconductor is removing the sacrificial silicide 156 and un-reacted sacrificial metal layers 152, preferably by a selective wet etch such as a 4:1 $H_2SO_4$/$H_2O_2$ etch at 90C. Removing the silicide leaves first 158 and second 159 recesses in the semiconductor layer 107 (see FIG. 6) which transfers the asymmetry of the deposited sacrificial metal layer 152. Thus, first recesses 158 can be offset a distance 154 from the side 155 of the dummy gate structure 120 as seen in the future drain areas of asymmetric substrate regions (i.e. first region 131 and second region 132). In addition, second recesses 159 can align with the dummy gate structure 120 as seen in the future source areas of asymmetric substrate regions (i.e. first region 131 and second region 132), and in the future source/drain areas of the symmetric substrate region (i.e. third substrate region 133).

Still referring to FIG. 6, the depth of the recesses 158/159 can be from about 5% to about 95% of the starting SOI layer 107 thickness (T) and ranges therebetween and is preferably about 80%. Accordingly, for a starting thickness (T) of 25 nm, the preferred recess depth (d) would be 20 nm deep, leaving a thickness (t) of the semiconductor layer 107 at the bottom of the recesses of about 5 nm. The offset distance 154 can be from about from about 2 nm to about 50 nm and ranges therebetween, and is preferably around 10 nm.

Figure 7A:
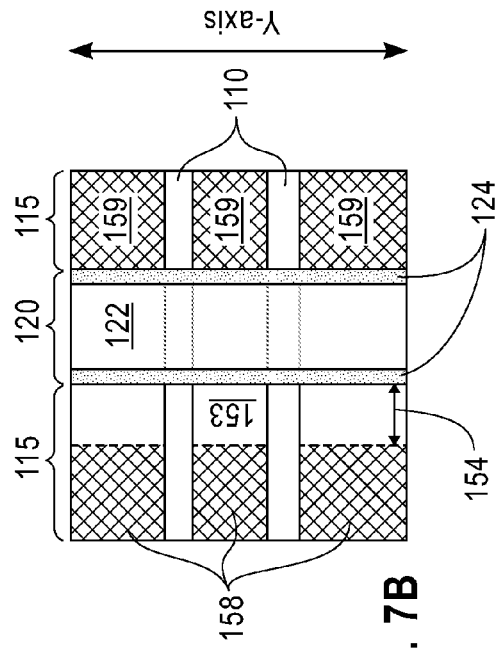
FIG. 7A illustrates a three dimensional view of substrate with asymmetric recesses and untrimmed patterned fin hard masks according to an embodiment of the current invention.
Figure 7B:
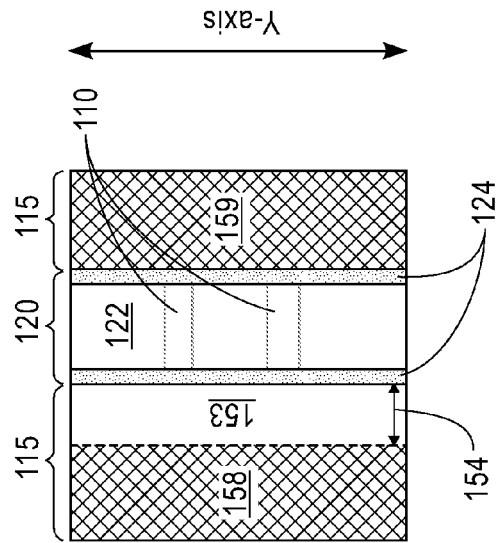
FIG. 7B illustrates a top down view of substrate of FIG. 7A.
Figure 7C:
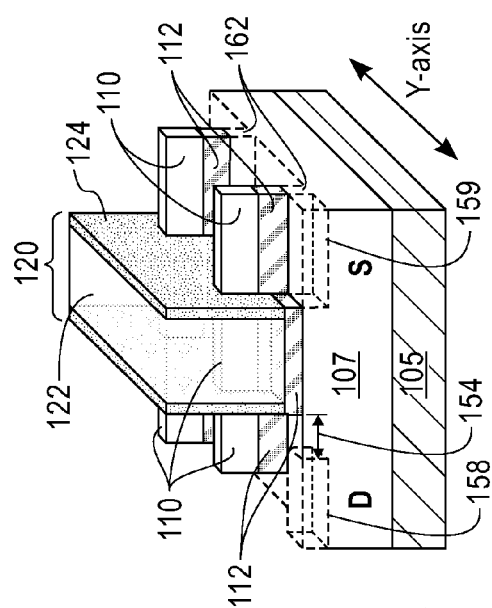
FIG. 7C illustrates a three dimensional view of substrate with asymmetric recesses and trimmed patterned fin hard mask according to an embodiment of the current invention.
Figure 7D:
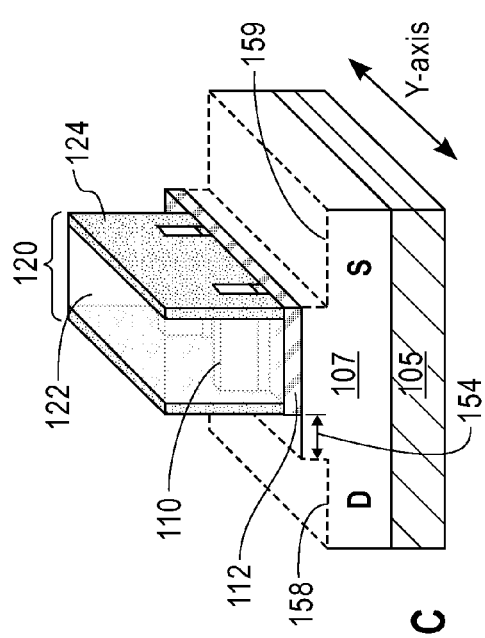
FIG. 7D illustrates a top down view of substrate of FIG. 7C.

Referring to FIGS. 7A-D, different views of trimmed and untrimmed embodiments of the invention after asymmetric recess formation are shown to better understand embodiments. All FIG. 7 illustrate, by way of example and not limitation, the second region 132 of the substrate, or in other words, the figures illustrate a source down configuration. FIGS. 7A and B illustrate in three dimensional and top down views, respectively, an untrimmed embodiment. FIGS. 7C and D illustrate in three dimensional and top down views, respectively, a trimmed embodiment. Comparing the two embodiments, it is seen that in the trimmed embodiment (FIGS. 7C and D) the first 158 and second 159 recesses are uninterrupted along the Y-axis because there is no patterned fin hard mask 110 in the field region 115 of the substrate. In contrast, in the untrimmed embodiment (FIGS. 7A and B) there are multiple first 158 and second 159 recesses in the semiconductor layer 107 because in the field region 115 patterned fin hard mask 110 blocked the recess etch. Therefore, field fins 162 appear in the semiconductor layer 107 under the patterned fin hard mask 110 in the field region 115 of the untrimmed embodiment. Reference numeral 153 of FIGS. 7C and 7D refer to a plateau 153 formed by the off-set 154 distance of the first recess 158.

Referring to FIGS. 8-9, step 30 of creating a non-planar MOSFET with asymmetric, recessed source drains is forming the source drain regions. Creating source drain regions entails incorporating dopants in the semiconductor layer 107 to form source drain junctions. In addition, a silicide to make contact with the source/drains is also disclosed. Each step will be discussed in further detail below.

Generally, a junction 129 is where two areas of dissimilar doping meet. The doping difference can be in the type of dopant (n or p, for example), or in terms of dopant concentration levels (heavily doped versus lightly), or both.

To form a junction, doped source and drains are made. In a preferred embodiment, dopants are incorporated into the semiconductor layer 107 to form source/drain junctions by implanting ions into the substrate followed by annealing.

Suitable p-type doping agents are group V elements including boron, aluminum and gallium. Suitable n-type doping agents are group III elements including antimony, phosphorous and arsenic. The doping agent can be implanted at a tilt angle. In addition more than one implantation step (light vs. heavy, tilt vs. normal, for example) can be used to form a junction.

The next paragraphs will further discuss the junctions in terms of position of the junction in untrimmed and trimmed embodiments of the present invention.

Figure 8B:
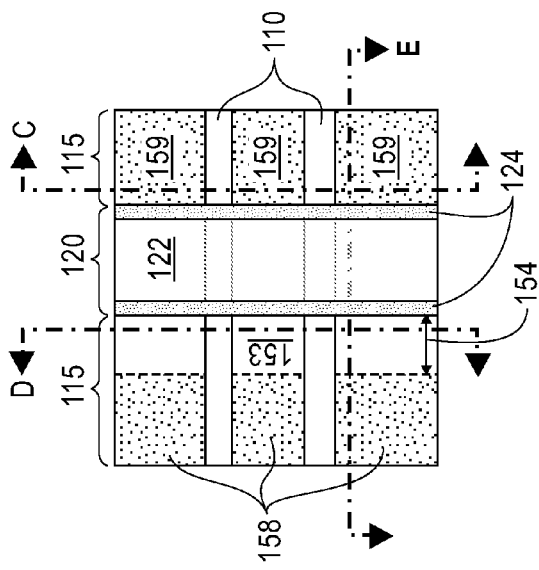
FIG. 8B illustrates a top down view of substrate of FIG. 8A.
Figure 8A:
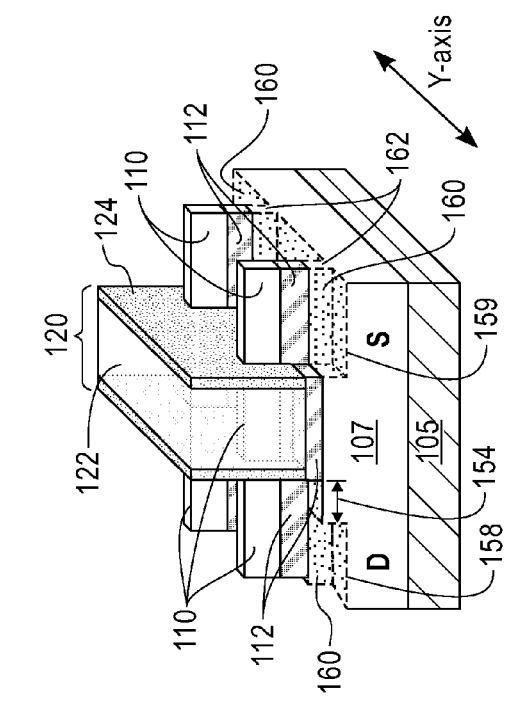
FIG. 8A illustrates a three dimensional view of substrate with asymmetric recesses and dopants and untrimmed patterned fin hard masks according to an embodiment of the current invention.

Referring to FIGS. 8A-E, an untrimmed substrate is shown from various viewpoints after junction formation. FIG. 8A is a three-dimension representation with dopants 160 in exposed portions of the semiconductor layer 107. Namely, dopants 160 are in the first recess 158, up a sidewall of the first recess 158 and onto a plateau 153 in the semiconductor layer 107 formed by the offset distance 154. The dopants are also in the second recess 159 and up its sidewalls.

FIG. 8B shows top down view of the substrate illustrated in FIG. 8A. FIG. 8B shows dotted lines where cross-sections of the substrate are illustrated in FIGS. 8C-E.

Figure 8E:
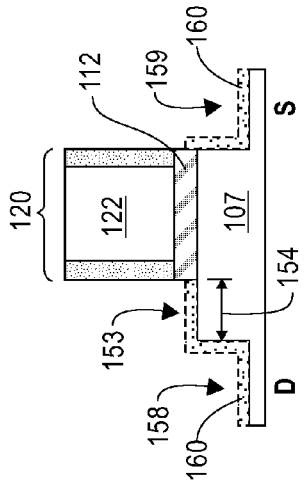
FIG. 8E illustrates a cross-section of FIG. 8A perpendicular to the dummy gate structure according to an embodiment of the current invention.
Figure 8D:
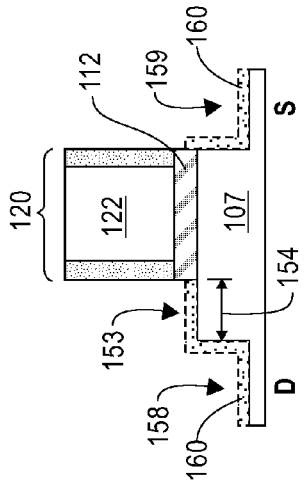
FIG. 8D illustrates a cross-section of FIG. 8A perpendicular to the patterned fin hard mask in the field region and through the second recess in the semiconductor layer according to an embodiment of the current invention.
Figure 8C:
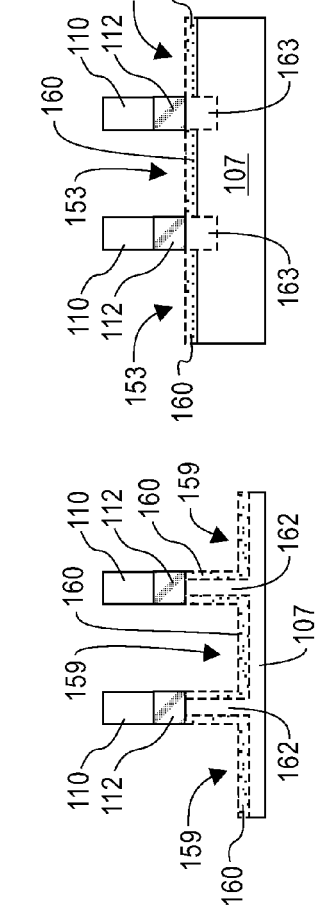
FIG. 8C illustrates a cross-section of FIG. 8A perpendicular to the patterned fin hard mask in the field region and through the offset region of the semiconductor layer according to an embodiment of the current invention.
Figure 10A:
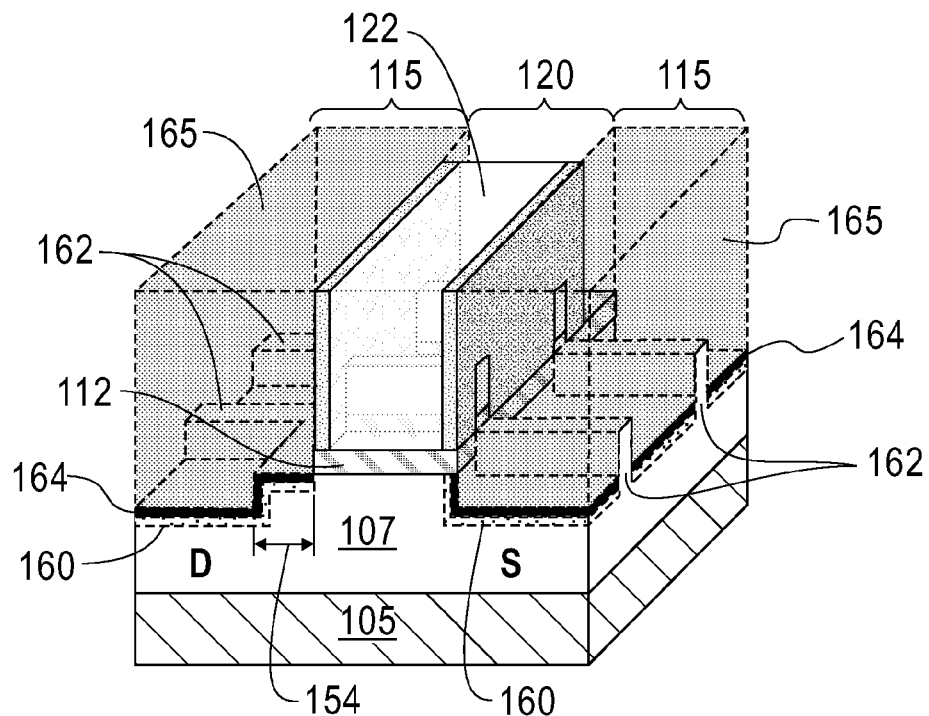
FIG. 10 illustrates a substrate after filler layer formation according to an embodiment of the current invention.
Figure 10B:
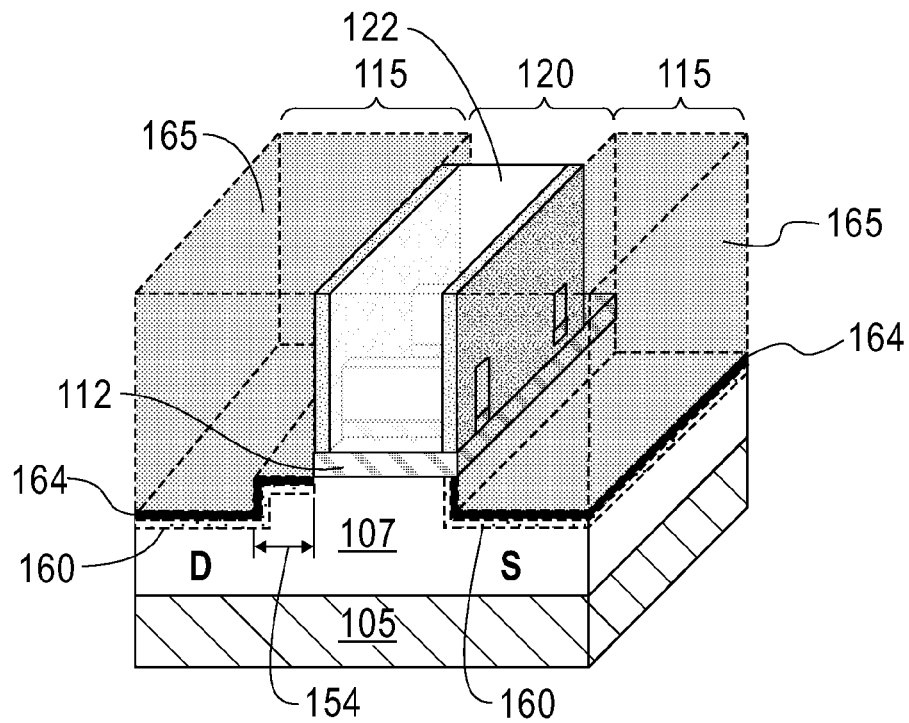

Referring to FIG. 8C, it is a cross-section perpendicular to the patterned hard mask 110 and through the second recess 159. The dopant is in a portion of the semiconductor layer 107 of the second recess 159 and up its sidewalls. However, the dopant is substantially missing from the semiconductor layer 107 under the patterned hard mask 110 (i.e. the semiconductor layer 107 comprising the field fin 162) because the hard mask 110 blocked ion implanted dopants. Thus, in the untrimmed embodiment, a substantially non-doped (or lightly doped) area of the semiconductor layer 107 exists under the patterned hard mask 110 in the field areas 115 of the substrate. In FIG. 8C, the substantially non-doped (or lightly doped) area corresponds to the field fins 162. The terms "substantially non-doped" and "lightly doped" are used because dopant 160, may diffuse to areas even if they were not directly implanted into these areas. Similarly, FIG. 8D, which it is a cross-section of an untrimmed substrate perpendicular to the patterned fin hard mask 110 and through the plateau 153 also has doped areas 160 where the semiconductor layer 107 was exposed during junction implantation, and substantially non-doped (or lightly doped) areas under the patterned fin hard masks 110 in the plateau 153 region of the semiconductor layer 107 formed by off-set 154. Herein, the substantially non-doped (of lightly doped) areas under the patterned hard mask 110 in the plateau 153 region of the semiconductor layer 107 will be referred to as "plateau fins" 163. It should be noted that plateau fins 163 are not really fins in that they are substantially co-planar with the plateau 153.

Finally, FIG. 8E illustrates a cross-section perpendicular to the dummy gate structure 120 of an embodiment of an untrimmed substrate. Here, on the left side of the dummy gate structure (and because a source down configuration is shown in this embodiment, the left side is the drain), dopants 160 are shown in the semiconductor layer 107 in the first recess 158, up its sidewall and on the plateau 153 created by offset distance 154. There are no dopants 160 in the area under the dummy gate structure 120. There are dopants in exposed portions of the semiconductor layer 107 in the second recess 159 and its sidewalls.

FIG. 8E illustrates the structural asymmetry of the S/D regions. Here, the left side of the transistor (drain, in this embodiment) has a first recess 158 which is offset a distance 154 from the dummy gate structure 120 (i.e. the future gate and channel region of the transistor). Meanwhile the right side of the transistor (source, in this embodiment) has a second recess 159 which is self-aligned with the dummy gate structure 120 (future gate and channel region of the substrate). Thus, even if the two sides of the transistor receive the same ion implantation process, there will be a difference in the effective doping due to the structural difference created by the offset distance 154 from the dummy gate structure 120.

Referring to FIGS. 9A-D, a trimmed substrate is shown from various viewpoints after junction formation. FIG. 9A is a three-dimension representation with dopants 160 in exposed portions of the semiconductor layer 107. Namely, dopants 160 are in the first recess 158, up a sidewall of the first recess 158 and onto a plateau 153 in the semiconductor layer 107 formed by the offset distance 154. The dopants are also in the second recess 159 and up its sidewalls.

FIG. 9B shows top down view of the substrate illustrated in FIG. 9A. FIG. 9B shows dotted lines where cross-sections of the substrate are illustrated in FIGS. 9C-D.

Referring to FIG. 9C, it is a cross-section through a trimmed substrate parallel to the dummy gate structure 120 and through the second recess 159. The dopant is in the semiconductor layer 107 of the second recess 159. Unlike FIG. 8C, the dopant 160 is uniform, uninterrupted area because there is no patterned hard mask 110 in the field region to block implantation. Similarly, FIG. 9D, which it is a cross-section of a trimmed substrate parallel to the dummy gate structure 120 and through the plateau 153 also has uniform, uninterrupted doped areas 160 where the semiconductor layer 107 was exposed during junction implantation.

Finally, a cross-section perpendicular to the dummy gate structure 120 of an embodiment of a trimmed substrate is not illustrated because the cross section would appear the same as that in FIG. 8E of the untrimmed embodiment. Thus, FIG. 8E comments are not repeated here and the reader is referred to the description given in FIG. 8E.

The junction depth (the thickness of the doped material in silicon layer 107) can be from about 5 nm to about 40 nm and ranges therebetween, and is preferably around 10 nm. Thus, in some embodiments, the entire semiconductor layer 107 thickness (t) at the bottom of the recesses 158/159 can be doped.

A silicide is formed which serves to contact at least a portion of the source/drains. Silicide materials and formation methods described in conjunction with the sacrificial silicide apply to the source drain silicide and will not be repeated here. The only difference is that the metal which forms the source drain silicide will be deposited conformally, rather than directionally. Thus the deposition angle is zero (i.e. normal to the surface of the substrate). The silicide is formed on the exposed regions of the semiconductor layer 107, meaning the silicide forms over doped 160 areas of the semiconductor layer 107. The silicide thickness should be less than the junction depth and can be from about 4 nm to about 20 nm and ranges therebetween, and is preferably around 10 nm. The thickness of a remaining semiconductor layer 107 below the recesses 158/159 is from about 5 nm to about 20 nm and ranges therebetween, and is preferably 5 nm.

Step 40 of creating a non-planar MOSFET with asymmetric, recessed source drains is forming and filler layer 165. Initially, the filler layer 165 is deposited so as to cover the dummy gate structure 120. The filler layer 165 is then planarized with a method such as chemical mechanical planarization or etch back. After planarization, the top of the dummy gate structure 120 is exposed and the filler layer 165 and dummy gate structure are co-planar (see FIGS. 10A and 10B for untrimmed and trimmed embodiments, respectively).

Filler layers 165 are typically insulators. Insulators include, but are not limited to, silicon dioxide ($SiO_2$), silicon oxides (SiOH), doped silicon glass, silicon carbon oxide (SiCO), SiCOH, and silicon carbide (SiC). The filler layer 165 can be a single layer of an insulator or comprise multiple layers of different insulators.

In the untrimmed embodiment, the patterned hard mask 110 in the field region (i.e. the hard mask not covered by the dummy gate structure 120) is preferably removed prior to forming the filler layer 165 (See step 35 of flow chart 5). By removing the patterned hard mask 110 in the field region after the recesses have been formed, the field fin 162 is exposed.

Figure 11:
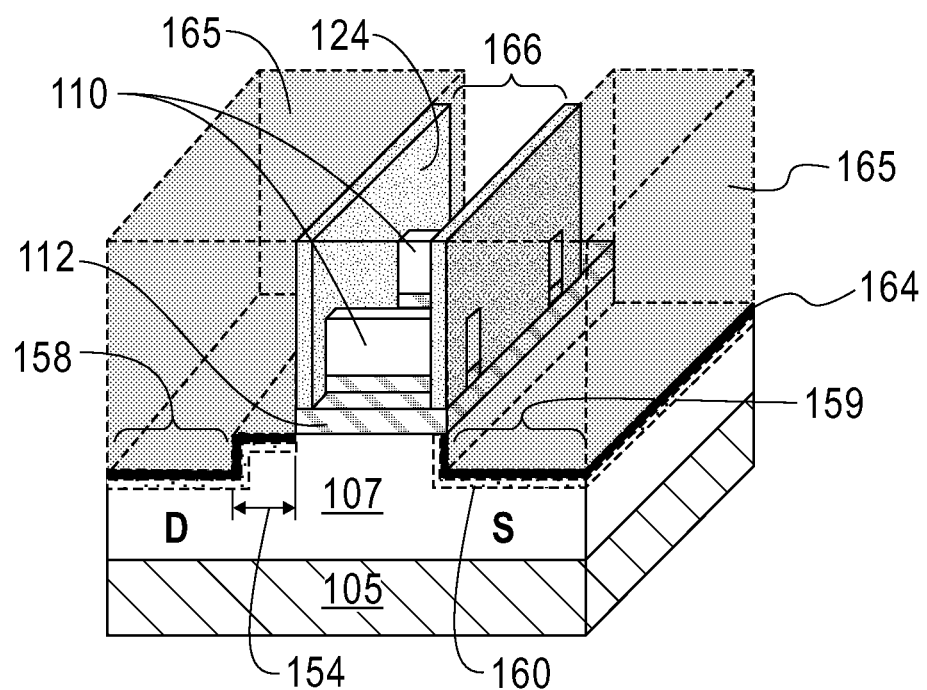
FIG. 11 illustrates a substrate after dummy gate structure removal according to an embodiment of the current invention.

Referring to FIG. 11, step 50 of making a non-planar MOSFET with asymmetric, recessed source drains is removing at least a portion of the dummy gate structure 120. Removing at least a portion of the dummy gate structure 120 creates a trench opening 166 revealing the patterned fin hard mask 110 in the gate region of the substrate. The dummy gate removal etch can be selective to the underlying oxide 112. In the FIG. 11 embodiment, only the dummy gate 122 portion of the dummy gate structure 120 was removed, leaving the optional dummy gate spacer 124 in place. The dummy gate spacer 124 could also be removed, if desired.

Figure 12A:
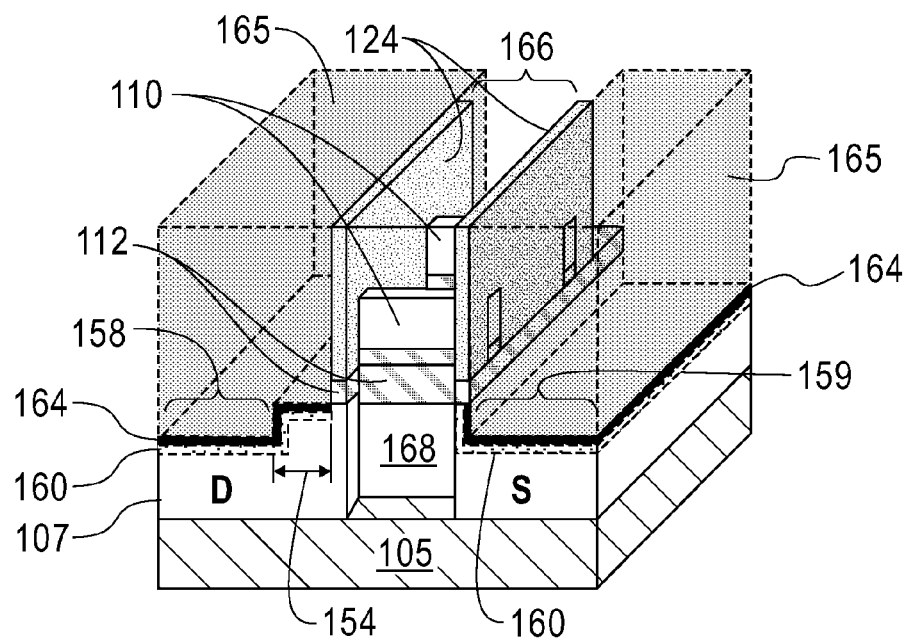
FIG. 12A illustrates a substrate after channel fin formation etch according to an embodiment of the current invention.

Referring to FIG. 12A, step 60 of making creating a non-planar MOSFET with asymmetric, recessed source drains is etching the channel fins 168 into the semiconductor layer 107 using the patterned fin hard mask 110 in the gate region. A reactive ion etch (RIE) is used to etch the semiconductor layer 107 stopping on the BOX 105.

Figure 12B:
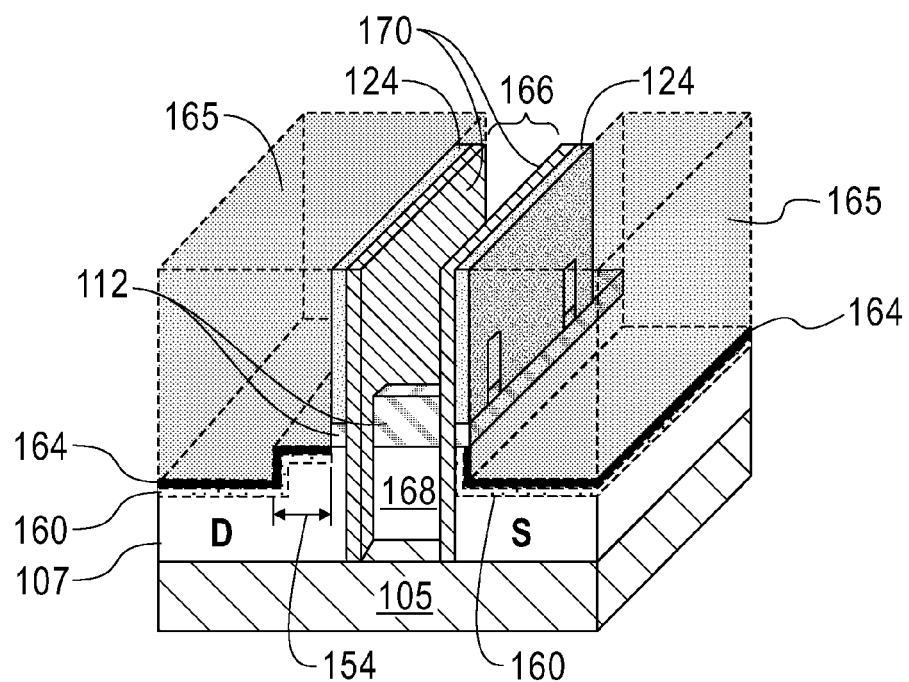
FIG. 12B illustrates a substrate with optional inner spacers according to an embodiment of the current invention.

Referring to FIG. 12B, an optional inner spacer 170 can be formed after channel fin etch. The inner spacer 170 can be made of any of the materials listed in the description of the optional dummy gate spacer 124. Preferably, the inner spacer 170 is silicon nitride. Using an inner spacer 170 reduces parasitic capacitance. However, the use of an inner spacer is optional, because unlike typical non-planar MOSFET methods, the inner spacer 170 is not needed to prevent gate-to source/drain shorting because there are no raised source/drains.

Still referring to FIG. 12B, the patterned hard mask 110 has been removed. It can be removed in conjunction with the channel fin 168 etch, as part of the inner spacer 170 etch, or by separate etch. In addition, the embodiment illustrated in FIG. 12B shows the optional oxide layer 112 remaining over the channel fin 168. In such an embodiment, the channel fin 168 will become part of a FinFET transistor. In an alternate embodiment (not shown) the optional oxide layer 112 is removed from the top of the channel fin 168. In the alternate embodiment lacking the oxide layer 112, the channel fin 168 becomes part of a tri-gate transistor.

Figure 13:
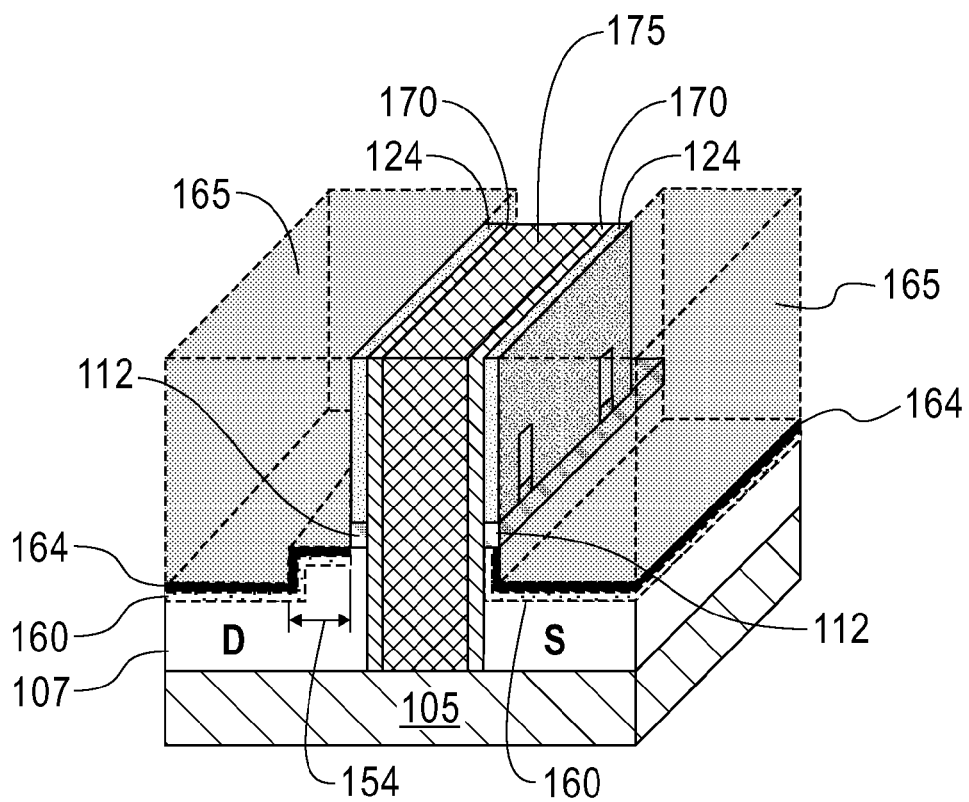
FIG. 13 illustrates a completed substrate with gate stack according to an embodiment of the current invention.

Referring to FIG. 13, step 70 is forming a gate stack 175. Although illustrated for simplicity as a solid block in FIG. 13, the gate stack includes at least one insulating layer in contact with the channel fin 168 and at least one conducting layer.

The insulating layer can be an oxide and is preferably a high dielectric constant (herein "high-k") material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum. High-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metal organic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of those methods. The high-k thickness may range from about 0.5 nm to about 3 nm or any other range therebetween. An interfacial layer such as silicon oxide, silicon nitride, silicon oxynitride (not shown) may be formed on the channel fin 168 before high-k deposition.

The conductor layer(s) of gate stack 175 can include, but is not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material(s) can further include dopants that are incorporated during or after deposition. Suitable processes described above for high-k deposition can be used for forming the conductive layer of the gate stack 175. The thickness of the gate stack 175 may range from 10 nm to 100 nm or any other range in between.

This concludes the description of the method of making non-planar MOSFETs with asymmetric, recessed source/drains. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

Non-Planar MOSFET with Asymmetric, Recessed Source/Drains

Next, embodiments of the non-planar MOSFETs created by methods previously described are illustrated.

FIGS. 14A-F illustrate a non-planar MOSFET with asymmetrical, recessed source/drains made by a trimmed method. FIG. 14A is a top down view of the MOSFET. Moving from left to right along the x-axis of FIG. 14A, in the field region 115, a first recess 158 in the semiconductor layer is off-set a distance 154 from the gate region to form a plateau 153 in the semiconductor layer. Various spacers (124, 170) and a gate stack 175 can make up the gate region. Under the gate stack 175 are channel fins 168 which may be capped by an oxide layer 112. In the field region 115 to the right of the gate region, a second recess 159 is in the semiconductor layer 107.

Still referring to FIG. 14A, in this embodiment, the field region having the first recess 158 off-set 154 from the gate stack 175 (i.e. the region to the left of the gate stack 175), contains a drain (as indicated by the "D"). The field region to the right of the gate stack which has the second recess aligned with the gate stack contains the source as indicated by the "S". Thus, a source down configuration is shown in this embodiment.

Referring to FIG. 14B, a cross-section along the y-axis through the gate region of the MOSFET of FIG. 14A is illustrated. The cross-section shows two channel fins 168 formed from semiconductor layer 107 above the BOX 105. (Note, the bulk layer below the BOX 105 is not shown for ease of illustration). The channel fins have a first side 181, a second side 182, and a third side 183. The first and second sides 181, 182 are in contact with the gate stack 175. Therefore, in this embodiment, the two sides (181 and 182) form first and second channels of a FinFET. The third side, in this embodiment, is topped by an optional oxide layer 112, therefore, the third side as illustrated in FIG. 14B is not part of an FET channel. In an alternate embodiment, the optional oxide layer 112 may be omitted so that the third side 183 of the channel fin 168 is in contact with the gate stack 175. In the alternate embodiment, the channel fin 168 has three channels and is part of a tri-gate transistor.

Referring to FIG. 14C, a cross-section along the x-axis through a channel fin 168 of the MOSFET of FIG. 14A is illustrated. In a field region 115 to the left of the gate stack 175 and any spacers, there is a first recess 158 (dotted box) of the semiconductor layer 107 which is off-set from the gate region by a distance 154. The offset distance 154 creates a plateau 153 in the semiconductor layer 107. At least part of the semiconductor layer 107 in the first recess 158 and in the plateau 153 has dopants 160 and a silicide 164. In a field region 115 to the right of the gate stack 175 and any spacers, there is a second recess 159 (dotted box) of the semiconductor layer 107. The semiconductor layer 107 in the second recess 159 has dopants 160 and a silicide 164. The semiconductor layer 107 under the gate region (i.e. under the gate stack 175 and any spacers) is the channel fin 168.

Referring to FIG. 14D, is an enlarged top down view of a portion of FIG. 14A with gate stack 175, spacers, filler layer 165, and source/drain silicide 164 removed for clarity.

Referring to FIG. 14E, a cross-section along the y-axis at the point where the gate region meets field region 115 having an offset 154 is shown. The point of the cross-section is identified in FIGS. 14C and D by arrows. The cross-section is viewed from the channel fin 168 looking toward the plateau 153 created by the offset 154. Referring to FIG. 14E, in the foreground is channel fin 168 capped by an oxide layer 112. Behind the channel fin 168 is the plateau 153. A top portion of the plateau 153 has dopants 160. Therefore, the first side 181 and the second side 182 of the channel fin 168 are contacting semiconductor of the plateau 153 in which much of the dopant has been offset by an amount 154. The first side 181 and the second side 182 of the channel fin 168 are contacting undoped semiconductor of the plateau 153 along the majority of their distances, and only contact doped semiconductor of plateau 153 at their tops. Thus, a portion of the drain junction is off-set from the gate stack relative to the source junction; specifically, the portion of the drain junction in the recess 158 is off-set from the gate stack relative to the source junction. Stated another way, the drain junction is more under-lapped relative to the gate stack than the source junction. An under-lapped drain is useful to reduce Miller (drain-side) parasitic capacitance.

Referring to FIG. 14F, a cross-section along the y-axis at the point where the gate region meets a second recess 159 in the field region 115 is shown. The point of the cross-section is identified in FIGS. 14C and D by arrows. The cross-section is viewed from the channel fin 168 looking toward the sidewall of the second recess 159. Referring to FIG. 14F, in the foreground is channel fin 168 capped by an oxide layer. Behind the channel fin 168 is a sidewall of the second recess 159. The entire second recess 159 (including its sidewalls) has dopants 160. Therefore, the first side 181 and the second side 182 of the channel fin 168 are contacting doped semiconductor in the second recess 159. The contact with doped semiconductor is made along the full height of the sidewall in contrast to FIG. 14E in which only the top portion of the first and second sides 181/182 contacted doped semiconductor. Therefore, the source side of the transistor is not off-set from the doping. Stated another way, the source junction is more overlapped with the gate stack compared with the drain junction. A more overlapped source junction is useful for lowering source-side Rext.

In an alternative embodiment, oxide layer 112 is absent, such that the third side 183 of channel fin 168 can function a third channel. Referring to FIGS. 14E and F, where the third side 183 of the channel fin 168 meets the plateau 153, there is dopant 160. Similarly, where the there is dopant 160 at the top of the on opposing sides of channel fin 168 third side 183 of the channel fin 168 meets the sidewall of the second recess 159, there is dopant. Thus, a third channel on the third side 183 of the channel fin 168 is symmetric.

Comparing FIGS. 14E and 14F, source/drains on opposing sides of gate stack have different doping where the source/drain meets the first and second sides 181/182 of the channel fin 168. Thus, the source/drains associated with first and second channels are asymmetric. The asymmetry arises from the fact that one of the source/drains has a recess off-set from the gate stack, while the other has recess which aligns with the gate stack. Because the source/drains are physically asymmetric, the doping is different in the source vs. the drain (i.e. the doping is different on opposing sides of the gate stack 175). Because the doping is different on opposing sides of the gate stack 175, the first 181 and second 182 sides of the channel fins 168 which contact the source and drains create asymmetric first and second channels of a non-planar FET. The symmetry/asymmetry of MOSFETs formed by the trimmed process is summarized in Table 1.

TABLE 1

Asymmetry of Trimmed Method MOSFETs

| Drain Side (Doping where Channel Fin 168 meets Plateau 153) | Channel | Source Side (Doping where Channel Fin 168 meets Second Recess 159) | FET Symmetry |
|---|---|---|---|
| Majority Undoped | 1st side (181) | Doped | Asymmetric (first channel) |
| Majority Undoped | 2nd side (182) | Doped | Asymmetric (second channel) |
| Doped | 3rd side (183) | Doped | Symmetric (third channel) |

FIGS. 15A-F illustrate a non-planar MOSFET with asymmetrical, recessed source/drains made by an untrimmed method. FIG. 15A is a top down view of the MOSFET. The MOSFET in FIG. 15A shares all the features described in FIG. 14A, those features will not be repeated here. In addition to the features described in conjunction with FIG. 14A, the non-planar MOSFET shown in FIG. 15A also has field fins 162 and plateau fins 163.

Referring to FIG. 15B, a cross-section along the x-axis through recess 158, plateau 153, gate stack 175 and recess 159 of the MOSFET of FIG. 15A is illustrated. In a field region 115 to the left of the gate stack 175 and any spacers, there is a first recess 158 (dotted box) of the semiconductor layer 107 which is off-set from the gate region by a distance 154. The offset distance 154 creates a plateau 153 in the semiconductor layer 107. The semiconductor layer 107 in the first recess 158 and in the plateau 153 has dopants 160 and a silicide 164. In a field region 115 to the right of the gate stack 175 and any spacers, there is a second recess 159 (dotted box) of the semiconductor layer 107. The semiconductor layer 107 in the second recess 159 has dopants 160 and a silicide 164.

Referring to FIG. 15C, a cross-section along the x-axis through a channel fin 168, field fin 162 and plateau fin 163 of the MOSFET of FIG. 15A is illustrated. In a field region 115 to the left of the gate stack 175 and any spacers, there is a field fin 162. The field fin 162 as shown in FIG. 15C can have no doping on because it was covered by the patterned fin hard mask 110 during recessed etch and subsequent junction formation. Alternatively the field fin 162, despite being covered by the patterned fin hard mask 110 during dopant implantation, can have dopants 160 which have diffused from regions not covered by the patterned fin hard mask 162 (i.e. dopants diffused from first recess 158). The field fin 162 is composed on semiconductor layer 107. The field fin 162 in the field region 115 having the first recess 158 is bounded by first recesses 158 on two sides (See FIGS. 15A and 15D). Again referring to FIG. 15C and continuing to move to the right, a plateau fin 163 exits. The plateau fin 163 can be an undoped area (again because it was covered by patterned hard mask 110 during junction implantation) in the plateau 153, as Shown in FIG. 15C. Alternatively, the plateau fin 163 can have dopants 160 which diffused from regions uncovered during dopant implantation; in the case of a plateau fin 163, those uncovered regions are the plateau 153. Therefore, the doping of the plateau fin 163 will only occur in the top portion of the plateau fin 163 because the dopants 160 are diffusing from plateau 153 which only has dopants in the top portion. In a field region 115 to the right of the gate stack 175 and any spacers, there is another field fin 162. The field fins 162 on the side of the gate stack having the second recesses 159 are bounded by the second recesses on two sides. The semiconductor layer 107 under the gate region (i.e. under the gate stack 175 and any spacers) is the channel fin 168.

Referring to FIG. 15D, is an enlarged top down view of a portion of FIG. 15A with gate stack 175, spacers, filler layer 165 and source/drain silicide 164 removed for clarity.

Referring to FIG. 15E, a cross-section along the y-axis at the point where the gate region meets field region 115 having an off-set 154 is shown. The point of the cross-section is identified in FIGS. 15C and D by arrows. The cross-section is viewed from the channel fin 168 looking toward the plateau 153 created by the off-set distance 154. Referring to FIG. 15E, in the foreground is channel fin 168 capped by an oxide layer 112. Directly behind the channel fin 168 is the plateau fin 163 (the dotted arrow indicates plateau fin 163 is behind the channel fin 168). As shown in FIG. 15E, the plateau fin 163 is undoped; however, in an alternate embodiment explained above, the plateau fin 163 can have dopants 160 at the top portion which have diffused from plateau 153 which has dopants on its top portion. On either side of the plateau fin 163 is plateau 153. A top portion of the plateau 153 has dopants 160. Therefore, the first side 181 and the second side 182 of the channel fin 168 are contacting semiconductor of the plateau 153 in which much of the dopant has been offset by an amount 154. The first side 181 and the second side 182 of the channel fin 168 are contacting undoped semiconductor of the plateau 153 along the majority of their distances, and only contact doped semiconductor of plateau 153 at their tops. Thus, a portion of the drain junction is off-set from the gate stack relative to the source junction; specifically, the portion of the drain junction in the recess 158 is off-set from the gate stack relative to the source junction. Thus the drain junction of the transistor is more under-lapped relative to the gate stack than the source junction. An under-lapped drain is useful to reduce Miller (drain-side) parasitic capacitance.

Referring to FIG. 15F, a cross-section along the y-axis at the point where the gate region meets a second recess 159 in the field region 115 is shown. The point of the cross-section is identified in FIGS. 15C and D by arrows. The cross-section is viewed from the channel fin 168 looking toward the second recess 159. Referring to FIG. 15F, in the foreground is channel fin 168 capped by an oxide layer. Directly behind the channel fin 168 is the undoped field fin 162 (the dotted arrow indicates plateau fin 163 is behind the channel fin 168). On either side of the field fin 162 is doped sidewall of the second recessed 159 (the aligned recess). Therefore, the first side 181, and second side 182 of the channel fin 168 are contacting doped semiconductor of the second recess 159 (the aligned recess). Thus the source side of the transistor is not offset from the doping. Stated another way, the source junction is more overlapped with the gate stack compared with the drain junction. A more overlapped source junction is useful for lowering source-side Rext.

In an alternative embodiment, oxide layer 112 is absent, such that the third side 183 of channel fin 168 can function a third channel. Referring to FIGS. 14E and F, where the third side 183 of the channel fin 168 meets the plateau fins 163, there is no dopant. Thus, a third channel (and thus its transistor) on the third side 183 of the channel fin 168 is symmetric. However, in contrast to the trimmed embodiment of FIG. 14, here in FIG. 15 the third channel (and thus its transistor) is symmetric and undoped, whereas the in FIG. 14s the third channel (and thus its transistor) was symmetric and doped.

Bear in mind however, the untrimmed embodiment illustrated in FIG. 15 depict only one embodiment of the untrimmed process, the embodiment in which dopant does not diffuse from regions uncovered during dopant implantation (i.e. recesses 158/159 or plateau 153). In an alternative embodiment of the untrimmed process discussed above, the dopants 160 diffuse from regions uncovered during dopant implantation (i.e. plateau 153) into the top of plateau fin 163.

Thus, in the alternative untrimmed embodiment, the third side 183 of channel fin 168 (i.e. third channel of MOFET) contacts dopant on each side. Thus, creating a symmetric and doped third transistor.

Comparing FIGS. 54E and 15F, source/drains on opposing sides of gate stack have different doping where the source/drain meets the first and second sides 181/182 of the channel fin 168. Thus, the source/drains associated with first and second channels are asymmetric. Accordingly, the transistors formed from the first and second channels are asymmetric. The asymmetry arises from the fact that one of the source/drains has a recess off-set from the gate stack, while the other has recess which aligns with the gate stack. The symmetry/asymmetry of MOSFETs formed by the untrimmed process is summarized in Table 2.

TABLE 2

Asymmetry of Untrimmed Method MOSFETs

| Drain Side | Channel | Source Side | FET Symmetry |
|---|---|---|---|
| (Doping where Channel Fin 168 meets Plateau 153) | | (Doping where Channel Fin 168 meets Second Recess 159) | |
| Majority Undoped | $1^{st}$ side (181) | Doped | Asymmetric (first channel) |
| Majority Undoped | $2^{nd}$ side (182) | Doped | Asymmetric (second channel) |
| (Doping where Channel Fin 168 meets Plateau Fin 163) | | (Doping where Channel Fin 168 meets Field Fin 162) | |
| Undoped | $3^{rd}$ side (183) (one embodiment) | Undoped | Symmetric (third channel) |
| Doped | $3^{rd}$ side (183) (alternate embodiment) | Doped | Symmetric (third channel) |

This concludes the description of non-planar MOSFETs with recessed asymmetric source/drains. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A method of making a non-planar field effect transistor, the method comprising:
   providing a substrate having a semiconductor layer, a patterned fin hard mask above the semiconductor layer, and a dummy gate structure perpendicular to and above at least a portion of the patterned fin hard mask;
   forming a first recess and a second recess in the semiconductor layer on opposing sides of the dummy gate structure wherein the first recess is offset from a first side of the dummy gate structure;
   forming a source region and a drain region on opposing sides of the dummy gate structure;
   forming a filler layer above the substrate;
   removing at least a portion of the dummy gate structure to create an opening;
   etching, by using the patterned fin hard mask, a channel fin in the semiconductor layer in the opening; and
   forming a gate stack around the channel fin in the opening.

2. The method of claim 1, further comprising:
   after forming the first and second recesses, removing the patterned hard mask in the field area to form a field fin in the semiconductor layer.

3. The method of claim 1, wherein forming the first recess and the second recess comprises:
   depositing a sacrificial metal layer on the substrate;
   heating the substrate to react the sacrificial metal layer with the semiconductor layer to form a sacrificial metal silicide which consumes a portion of the semiconductor layer; and
   removing the sacrificial metal silicide to leave the first and second recesses in the substrate.

4. The method of claim 3, wherein depositing the sacrificial metal layer on the substrate is performed at a tilt angle so that the dummy gate structure blocks the deposition of the sacrificial metal layer on a portion of the semiconductor layer adjacent the first side of the dummy gate structure.

5. The method of claim 1, wherein forming the first recess and the second recess comprises:
   forming a patterned resist layer above the substrate, wherein the patterned resist layer reveals the dummy gate structure;
   depositing a sacrificial metal layer at a tilt angle on the patterned resist layer and the substrate; and
   Lifting-off an excess of the sacrificial metal layer deposited on the patterned resist layer.

6. The method of claim 5, wherein the patterned resist layer has a retrograde profile.

7. A method of making a plurality of non-planar, asymmetric, field effect transistors, the method comprising:
   providing a substrate having a first region, a second region, and a third region wherein each region of the substrate comprises a semiconductor layer, a patterned fin hard mask above the semiconductor layer, and a dummy gate structure perpendicular to and above at least a portion of the patterned fin hard mask;
   forming a first resist layer revealing the first region and blocking the second and the third regions of the substrate;
   forming a first region sacrificial metal layer by a first lift-off process wherein the first region sacrificial metal layer is asymmetrically disposed on opposing sides of the dummy gate structure in the first region;

forming a second resist layer revealing the second region and blocking the first and third regions of the substrate;

forming a second region sacrificial metal layer by a second lift-off process wherein the second region sacrificial metal layer is asymmetrically disposed on opposing sides of the dummy gate in the second region;

forming a third resist layer revealing the third region and blocking the first and second regions of the substrate;

forming a third region sacrificial metal layer by a third lift-off process wherein the third region sacrificial metal layer is symmetrically disposed on opposing sides of the dummy gate in the third region;

heating the substrate so that the first, second and third sacrificial metal layers consume a portion of the semiconductor layer to form first, second and third sacrificial silicide layers;

removing the first, second, and third sacrificial silicide layers to leave:

a first pair of recesses in the semiconductor layer asymmetrically arranged on opposing sides of the dummy gate structure in the first region, a second pair of recesses in the semiconductor layer asymmetrically arranged on opposing sides of the dummy gate structure in the second region, and a third pair of recesses in the semiconductor layer symmetrically arranged on opposing sides of the dummy gate structure in the third region;

forming source and drains in the first, second, and third regions;

forming a filler layer on the substrate;

removing at least a portion of the dummy gate structure in each region to create an opening in each region;

etching, through the opening in each region, a channel fin in the semiconductor layer by using the patterned hard mask; and forming a gate stack in the opening in each region.

8. A method of claim 7, wherein the first pair of recesses in the first region comprises a first recess aligned with the gate stack in the first region and a second recess offset from the gate stack in the first region.

9. A method of claim 8, wherein the second pair of recesses in the second region comprises a first recess offset from the gate stack in the second region and a second recess aligned with gate stack in the second region.

10. A method of claim 9, wherein the third pair of recesses in the third region are aligned with gate stack in the third region.

* * * * *